(12) United States Patent
Shamoto et al.

(10) Patent No.: US 7,246,052 B2
(45) Date of Patent: Jul. 17, 2007

(54) BUS MASTER AND BUS SLAVE SIMULATION USING FUNCTION MANAGER AND THREAD MANAGER

(75) Inventors: Eiji Shamoto, Tokyo (JP); Masahiro Fukuda, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 841 days.

(21) Appl. No.: 10/107,056

(22) Filed: Mar. 28, 2002

(65) Prior Publication Data

US 2002/0143512 A1 Oct. 3, 2002

(30) Foreign Application Priority Data

Mar. 30, 2001 (JP) ............... 2001-098738

(51) Int. Cl.
*G06F 17/50* (2006.01)
*G06F 15/16* (2006.01)
*G06F 13/00* (2006.01)

(52) U.S. Cl. ............ 703/17; 709/208; 709/209; 709/210; 709/211; 710/110; 710/113; 710/200; 703/16

(58) Field of Classification Search ............ 703/1–28; 709/208, 209, 210, 211; 710/1–269
See application file for complete search history.

(56) References Cited

U.S. PATENT DOCUMENTS

| | | | | |
|---|---|---|---|---|
| 4,506,324 A | * | 3/1985 | Healy | 703/21 |
| 4,868,741 A | * | 9/1989 | Gula et al. | 710/113 |
| 5,355,455 A | * | 10/1994 | Hilgendorf et al. | 710/306 |
| 5,418,914 A | * | 5/1995 | Heil et al. | 710/113 |
| 5,434,983 A | * | 7/1995 | Yaso et al. | 710/110 |
| 5,448,709 A | * | 9/1995 | Chandler et al. | 710/52 |
| 5,463,740 A | * | 10/1995 | Taniai et al. | 710/119 |
| 5,469,435 A | * | 11/1995 | Krein et al. | 370/462 |
| 5,493,672 A | * | 2/1996 | Lau et al. | 703/21 |
| 5,544,332 A | * | 8/1996 | Chen | 710/108 |
| 5,717,873 A | * | 2/1998 | Rabe et al. | 710/110 |
| 5,832,276 A | * | 11/1998 | Feiste et al. | 710/240 |
| 5,930,823 A | * | 7/1999 | Ito et al. | 711/152 |
| 5,978,838 A | * | 11/1999 | Mohamed et al. | 709/208 |
| 6,279,124 B1 | * | 8/2001 | Brouwer et al. | 714/38 |
| 6,466,898 B1 | * | 10/2002 | Chan | 703/17 |

(Continued)

FOREIGN PATENT DOCUMENTS

JP 11-296408 * 10/1999

*Primary Examiner*—Kamini Shah
*Assistant Examiner*—Kibrom K. Gebresilassie
(74) *Attorney, Agent, or Firm*—McGinn IP Law Group, PLLC

(57) ABSTRACT

The system simulator comprises master simulators $1f$, $1s$, $2f$ and $2s$ for simulating a bus master, a slave simulator L for simulating a bus slave, a function manager F for sequentially actuating the master simulator and the slave simulator by using a function call and a thread manager S for actuating the master simulator by using a thread switching. When the master simulator activated by using the function call from the function manager accesses the slave simulator and an access blocking is caused, the master simulator controls the thread manager such that the master simulator is activated by using the thread switching carried out by the thread manager. Thus, it is possible to carry out the simulation at a high speed without getting into a dead lock state caused by the access blocking and without changing the simulator for simulating a conventional bus master.

9 Claims, 21 Drawing Sheets

U.S. PATENT DOCUMENTS

| | | | |
|---|---|---|---|
| 6,490,642 B1 * | 12/2002 | Thekkath et al. | 710/110 |
| 6,507,808 B1 * | 1/2003 | LaFauci | 703/20 |
| 6,636,964 B1 * | 10/2003 | Okamura | 713/2 |
| 6,714,958 B1 * | 3/2004 | Tudor | 718/100 |
| 6,882,966 B2 * | 4/2005 | Ryu et al. | 703/14 |
| 6,981,081 B2 * | 12/2005 | Stevens et al. | 710/113 |
| 7,000,047 B2 * | 2/2006 | Nguyen et al. | 710/200 |
| 7,054,910 B1 * | 5/2006 | Nordin et al. | 709/208 |
| 7,069,422 B2 * | 6/2006 | Modelski et al. | 712/210 |
| 7,076,416 B2 * | 7/2006 | Chen et al. | 703/15 |
| 7,089,340 B2 * | 8/2006 | Penkovski et al. | 710/200 |
| 7,103,887 B2 * | 9/2006 | Shavit et al. | 718/102 |
| 2002/0019976 A1 * | 2/2002 | Patel et al. | 717/137 |
| 2002/0116449 A1 * | 8/2002 | Modelski et al. | 709/203 |
| 2002/0120798 A1 * | 8/2002 | Modelski et al. | 710/107 |
| 2002/0124085 A1 * | 9/2002 | Matsuda et al. | 709/226 |
| 2002/0129173 A1 * | 9/2002 | Weber et al. | 709/310 |
| 2003/0115564 A1 * | 6/2003 | Chang et al. | 716/8 |

* cited by examiner

Fig. 15 PROCESS FOR ADVANCING SYSTEM TIME OF MANAGER S BY ONE CLOCK

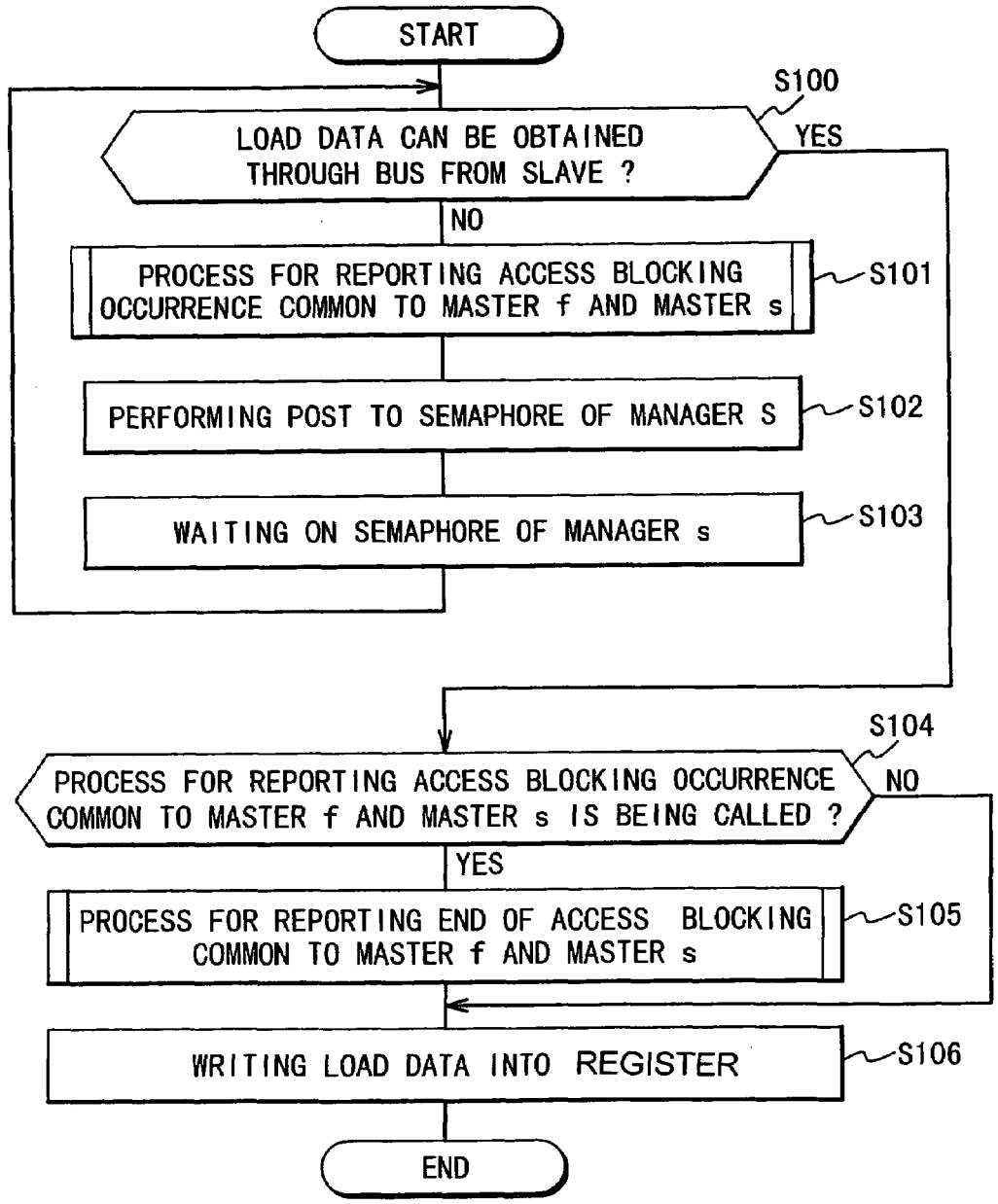

BUS MASTER AND BUS SLAVE SIMULATION USING FUNCTION MANAGER AND THREAD MANAGER

BACKGROUND OF THE INVENTION

1. Field of the Invention

The present invention relates to a system simulator, a simulation method and a simulation program. More particularly, the present invention relates to a technique for simulating such a system that a bus master and a bus slave are connected to each other through a bus.

2. Description of the Related Art

Conventionally, as an apparatus to which a microprocessor is applied, such a system that a bus master (hereafter, merely referred to as "Master") and a bus slave (hereafter, merely referred to as "Slave") are connected to each other through a bus is known. The software applied to this system is typically developed by using the hardware after the hardware environment to operate the software is prepared, in other words, after the completion of the development of the hardware.

However, in above-mentioned conventional developing method, a long time is required to develop the system. Therefore, recently, in order to reduce the developing period, such a developing method is employed that the development of the software is carried out on a system simulator. By employing this method, the development of the software can be carried out in parallel with the development of the hardware. As a result, the developing period can be reduced.

FIG. 1 shows a configuration of a conventional system simulator (hereafter, referred to as "system simulator according to a first conventional technique") used for the development of the software. This system simulator comprises a first master, a second master, a slave and a manager.

The first master is a simulator composed of a program for simulating an operation of a device used as a master such as CPU and DMA. The second master is another simulator composed of a program for simulating another device used as the master. The slave is a simulator composed of a program for simulating a peripheral circuit used as a slave such as a timer, a serial input output port, a general input output port and a memory. The manager is the control program for operating the first master, the second master and the slave in synchronization with each other.

The system simulator according to the first conventional technique having the above-mentioned configuration is used to verify the correctness of the program incorporated in each of the first master, the second master and the slave.

In the system simulator according to this first conventional technique, the simulation is advanced while the manager performs a function call to the first master, the second master and the slave, sequentially. In detail, the manager firstly performs the function call to the first master. Accordingly, the first master executes a process corresponding to one clock. For example, if the target of the function call is an instruction to be completed in one clock, the execution of the instruction is carried out. After that, the control is returned back to the manager. If the target of the function call is an instruction requiring a plurality of clocks, the control is returned back to the manager after the completion of a process corresponding to the one clock.

Next, the manager performs the function call to the second master, similarly to the above-mentioned case. Continuously, the manager performs the function call to the slave. After that, the simulation is advanced by that the function call to the first master □ the second master □ the slave □ the first master □ . . . is cyclically performed. It should be noted that, if the target of the function call is the instruction requiring the plurality of clocks, the execution of the instruction is completed by executing the plurality of function calls to the target.

As described above, the first master, the second master and the slave sequentially execute the process corresponding to the one clock for each execution of the function call from the manager. Thus, the first master, the second master and the slave are operated as if they are in synchronization with the clock. That is, it can be considered that the first master, the second master and the slave are operated such that the operational timings are given from the manager. Hence, it is possible to carry out the simulation in which the operational timings are considered.

FIG. 2 shows a configuration of another conventional system simulator (hereafter, referred to as "system simulator according to a second conventional technique") using a semaphore as a synchronizing mechanism for synchronizing a plurality of simulators with each other. The system simulator according to the second conventional technique always carries out a multi-thread operation.

The system simulator according to this second conventional technique comprises a first master, a second master, a slave, a manager and a bus. The first master, the second master, the slave and the manager have the functions similar to those of the above-mentioned conventional system simulator according to the first conventional technique, respectively. The bus is the simulator for simulating the operation of the bus when the first master and the second master access the slave.

In FIG. 2, symbols "□" in the first master, the second master, the manager and the bus denote the semaphores. A symbol "P" denotes an execution of a post, a symbol "W" denotes an execution of a wait, and a symbol "T" denotes an execution of a try wait, respectively. The try wait is a function of carrying out an inquiry to the bus. The system simulator according to this second conventional technique is controlled so as to activate only one of the first master, the second master and the manager at the same time.

Basically, the manager performs the post "P" to the semaphore of the first master and the second master (hereafter, they may be merely collectively referred to as "master"), and thereby activates the thread of the master, and the manager itself enters in the wait "W" state. Also, the master performs the post "P" to the semaphore of the manager, and thereby returns the control back to the manager, and the master itself enters in the wait "W" state. The slave is activated when the manager performs the function call to the slave, similarly to the system simulator according to the first conventional technique.

The actual operations of the system simulator according to this second conventional technique will be described below with reference to FIGS. 3 to 5.

FIG. 3 is an explanatory diagram showing the transfer operation between the manager and the first master. Dotted lines indicate the flow of the control. The manager firstly performs the post to the semaphore of the first master, and the manager itself enters in the wait state. This post operation activates the thread of the first master being in the wait state, and the try wait is performed to the semaphore of the bus. Then, if this try wait is unsuccessful, the first master performs the post to the semaphore of the manager, and the first master enters in the wait state.

FIG. 4 is an explanatory diagram showing the transfer operation between the manager and the second master. Dotted lines indicate the flow of the control. As mentioned above, when the control is transferred to the manager by that the first master performs the post to the semaphore of the manager, the manager then performs the post to the semaphore of the second master, and the manager itself enters in the wait state. This post operation activates the thread of the second master being in the wait state, and the try wait is performed to the semaphore of the bus. Then, if this try wait is unsuccessful, the second manager performs the post to the semaphore of the manager, and the second master enters in the wait state.

FIG. 5 is an explanatory diagram showing the transfer operation between the manager and the slave. Dotted lines indicate the flow of the control. As mentioned above, when the control is transferred to the manager by that the second master performs the post to the semaphore of the manager, the manager then performs the function call to the slave. If the slave becomes at a state responsible to an access request from the first master and the second master, the slave performs the post to the semaphore of the bus. This implies that the next try waits perfumed by the first and second masters are successful. After that, the control is returned from the slave to the manager. After that, the above-mentioned operations are repeated.

As mentioned above, the first and second masters, while carrying out the thread switching, sequentially execute the process corresponding to the one clock in each thread, and the slave executes the process corresponding to the one clock for each performance of the function call from the manager. Thus, the first master, the second master and the slave are operated as if they are in synchronization with the clock. Hence, it is possible to carry out the simulation in which the operational timings are considered.

In this system simulator according to the second conventional technique, when the master accesses the slave, even if an access blocking occurs, namely, even if the master fails in the try wait of the bus, there is no case that the master continues to wait for the response. Thus, there is no case that this system simulator gets into a dead lock state.

As a related art, Japanese Laid Open Patent Application (JP-A-Heisei 11-296408) discloses a software logic simulator for an assembled apparatus. This software logic simulator can attain a simulation for hardware by a plurality of applications, and carry out a linkage operation between them, and thereby simplify the description of the hardware operations, and further improve a debugging efficiency of software. According to this simulator, if the debugging operation is performed in linkage between the hardware simulator and the software, it is possible to solve the problems that the speed of the simulation of the hardware operation is very slow and that the description of the hardware has a defect.

However, the system simulator according to the first conventional technique has the following problem. That is, the program of the master includes the instruction to access to the slave. When the master executes this instruction, if the slave can respond to it within a time corresponding to the one clock, there is no problem. However, most of the slaves require several clocks for the response. The above mentioned phenomenon that the slave can not immediately respond to the access from the master is referred to as "Access Blocking". The access blocking includes a read access blocking and a write access blocking.

If the access blocking occurs, the master enters in the waiting state for waiting the response from the slave, and the control is not returned back to the manager. Consequently, the clock is not supplied to the slave. Thus, the master still continues the waiting state, and the system simulator gets into the dead lock state.

This problem can be solved by changing the specification of the slave on the system simulator such that the response is returned in one clock. However, in this approach, because the specification of the slave on the system simulator differs from that of the actual slave, it is impossible to carry out the simulation by considering the operation timing. The above-mentioned problem can be also solved by designing the program of the master such that the master being in the waiting state for waiting the response from the slave forcedly returns the control to the manager. However, in this approach, it is necessary to re-design the conventional program of the master. Moreover, when it is re-designed, the structure of the program of the master becomes complex. Thus, the development of the program of the master requires a large number of steps.

The system simulator according to the second conventional technique does not get into the dead lock state. However, it has the following problem. That is, in this system simulator, the thread switching is always performed under the control of a thread controller. Thus, this thread switching causes an occurrence of a loss time. The amount of the loss time is determined depending on the program installed in the master. According to the measurement by the inventors of the present invention, the simulation time of the system simulator according to the second conventional technique is equal to about 20 to 40 times the simulation time of the system simulator according to the first conventional technique.

SUMMARY OF THE INVENTION

Therefore, an object of the present invention is to provide a system simulator, a simulation method and a simulation program, which can carry out a simulation at a high speed without getting into a dead lock state and without changing a simulator for simulating a conventional bus master.

Means for achieving the object will be described below using reference numerals and symbols used in "Embodiments of the invention". These reference numerals and symbols are added so that relation between the description of "Scope of the Patent to be Claimed" and the description of "Embodiments of the invention" is made clear. However, it is never permitted to use the reference numerals and symbols for the interpretation of technical scopes of the inventions described in "Scope of the Patent to be Claimed" and the description of "Embodiments of the invention".

In order to attain the above-mentioned object, a system simulator according to a first aspect of the present invention comprises a master simulator ($1f$, $1s$, $2f$ and $2s$), a slave simulator (L), a function manager (F) and a thread manager (S). The master simulator ($1f$, $1s$, $2f$ and $2s$) simulates a bus master. The slave simulator (L) simulates a bus slave. The function manager (F) sequentially activates the master simulator ($1f$, $1s$, $2f$ and $2s$) and the slave simulator (L) by using a function call. The thread manager (S) activates the master simulator ($1f$, $1s$, $2f$ and $2s$) by using a thread switching. In this system simulator, when the master simulator ($1f$, $1s$, $2f$ and $2s$) activated by using the function call from the function manager (F) accesses to the slave simulator (L) and an access blocking is caused, the master simulator ($1f$, $1s$, $2f$ and $2s$) controls the thread manager (S) such that the master simulator ($1f$, $1s$, $2f$ and $2s$) is activated by using the thread switching carried out by the thread manager (S).

This system simulator can be designed such that the thread manager (S) further activates the slave simulator (L) by using the function call.

Also, after the access blocking is canceled, the thread manager (S) controls the function manager (F) such that the master simulator (1f, 1s, 2f and 2s) is activated by using the function call.

In order to attain the above-mentioned object, a simulation method according to a second aspect of the present invention comprises steps of (1) providing a master simulator (1f, 1s, 2f and 2s) for simulating a bus master and a slave simulator (L) for simulating a bus slave, (2) sequentially actuating the master simulator (1f, 1s, 2f and 2s) and the slave simulator (L) by using a function call and (3) actuating the master simulator (1f, 1s, 2f and 2s) by using a thread switching, when the master simulator (1f, 1s, 2f and 2s) activated by using the function call accesses to the slave simulator (L) and causes an access blocking.

This simulation method can be designed such that the step (3) further activates the slave simulator (L) by using the function call. Also, the simulation method further comprises actuating the master simulator (1f, 1s, 2f and 2s) by using the function call, after the access blocking is canceled.

In order to attain the above-mentioned object, a system simulation program according to a third aspect of the present invention comprises a master simulation program (1f, 1s, 2f and 2s), a slave simulation program (L), a function manager program (F) and a thread manager program (S). The master simulation program (1f, 1s, 2f and 2s) simulates a bus master. The slave simulation program (L) simulates a bus slave. The function manager program (F) sequentially activates the master simulation program (1f, 1s, 2f and 2s) and the slave simulation program (L) by using a function call. The thread manager program (S) activates the master simulation program (1f, 1s, 2f and 2s) by using a thread switching. In this system simulation program, when the master simulation program (1f, 1s, 2f and 2s) activated by using the function call from the function manager program (F) accesses to the slave simulation program (L) and an access blocking is caused, the master simulation program (1f, 1s, 2f and 2s) controls the thread manager program (S) such that the master simulation program (1f, 1s, 2f and 2s) is activated by using the thread switching carried out by the thread manager program (S).

This system simulation program can be designed such that the thread manager program (S) further activates the slave simulation program (L) by using the function call. Also, after the access blocking is canceled, the thread manager program (S) controls the function manager program (F) such that the master simulation program (1f, 1s, 2f and 2s) is activated by using the function call.

BRIEF DESCRIPTION OF THE DRAWINGS

FIG. 21 is a flowchart showing in detail a process of a step S95 in FIG. 20.

DESCRIPTION OF THE PREFERRED EMBODIMENT

Embodiment of the present invention will be described below in detail with reference to the attached drawings.

Figure 1:
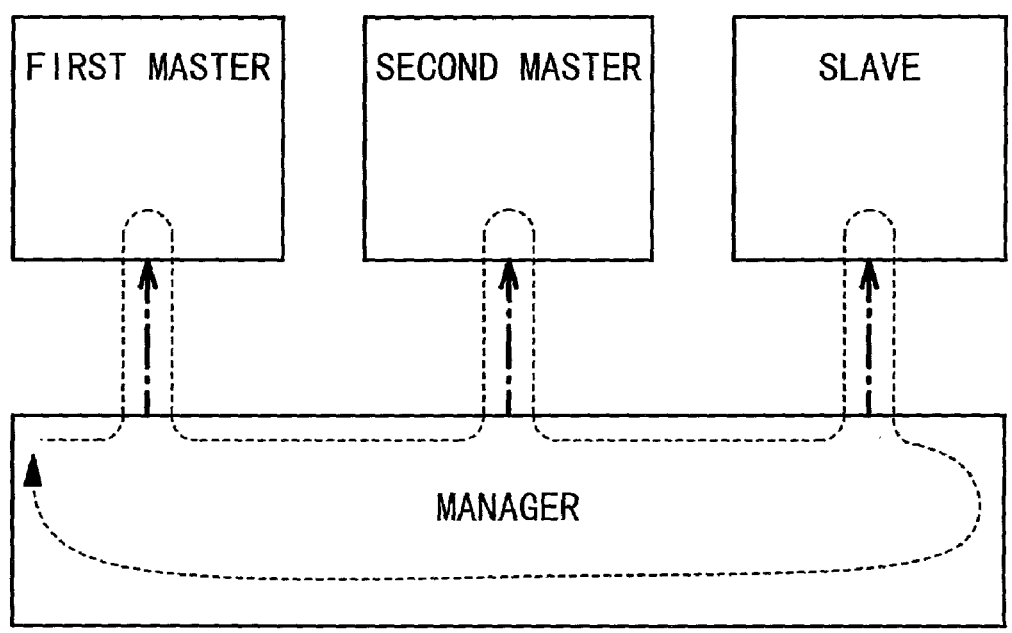
FIG. 1 shows a configuration of a system simulator according to a first conventional technique.
Figure 2:
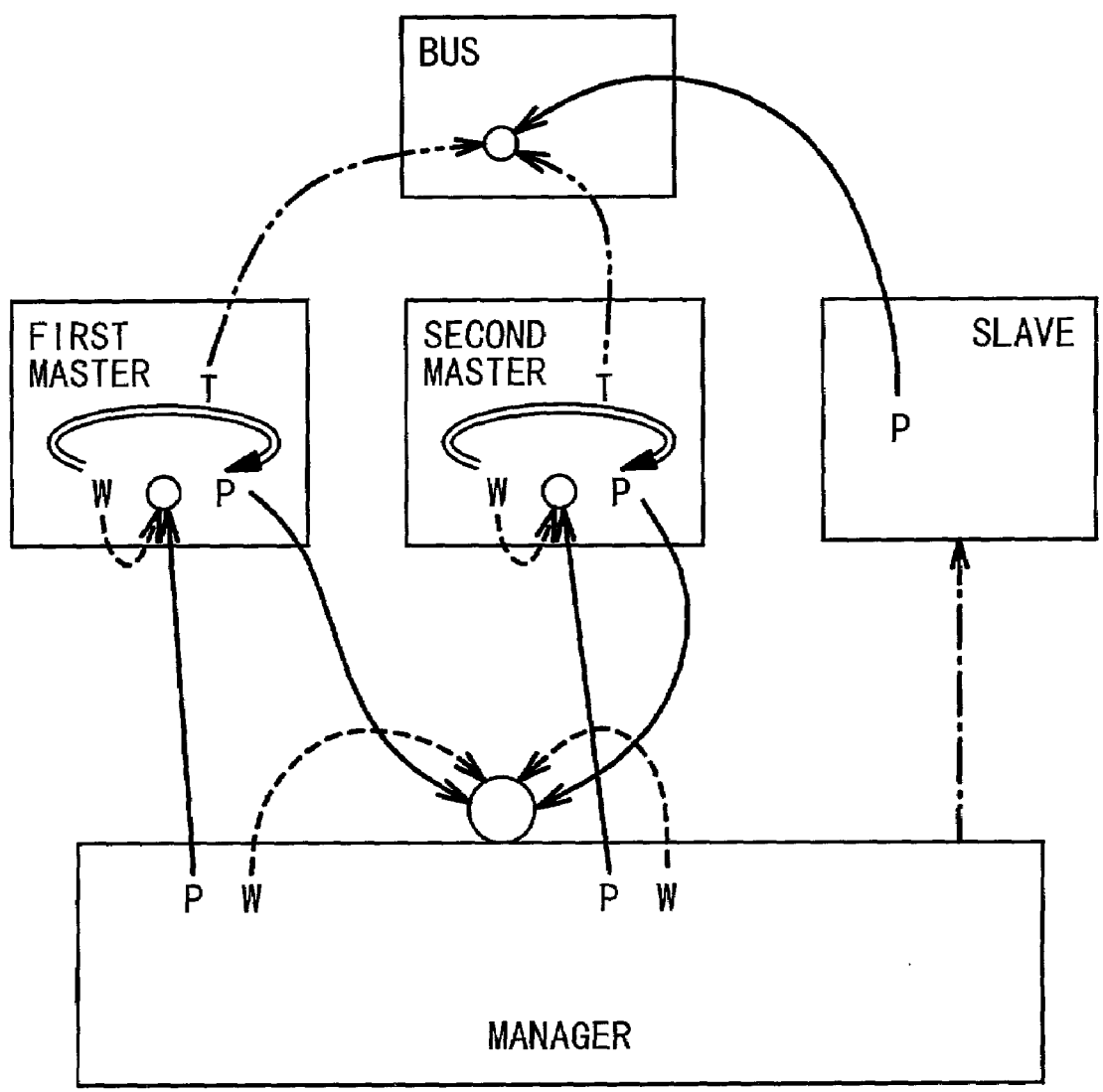
FIG. 2 shows a configuration of another system simulator according to a second conventional technique.
Figure 3:
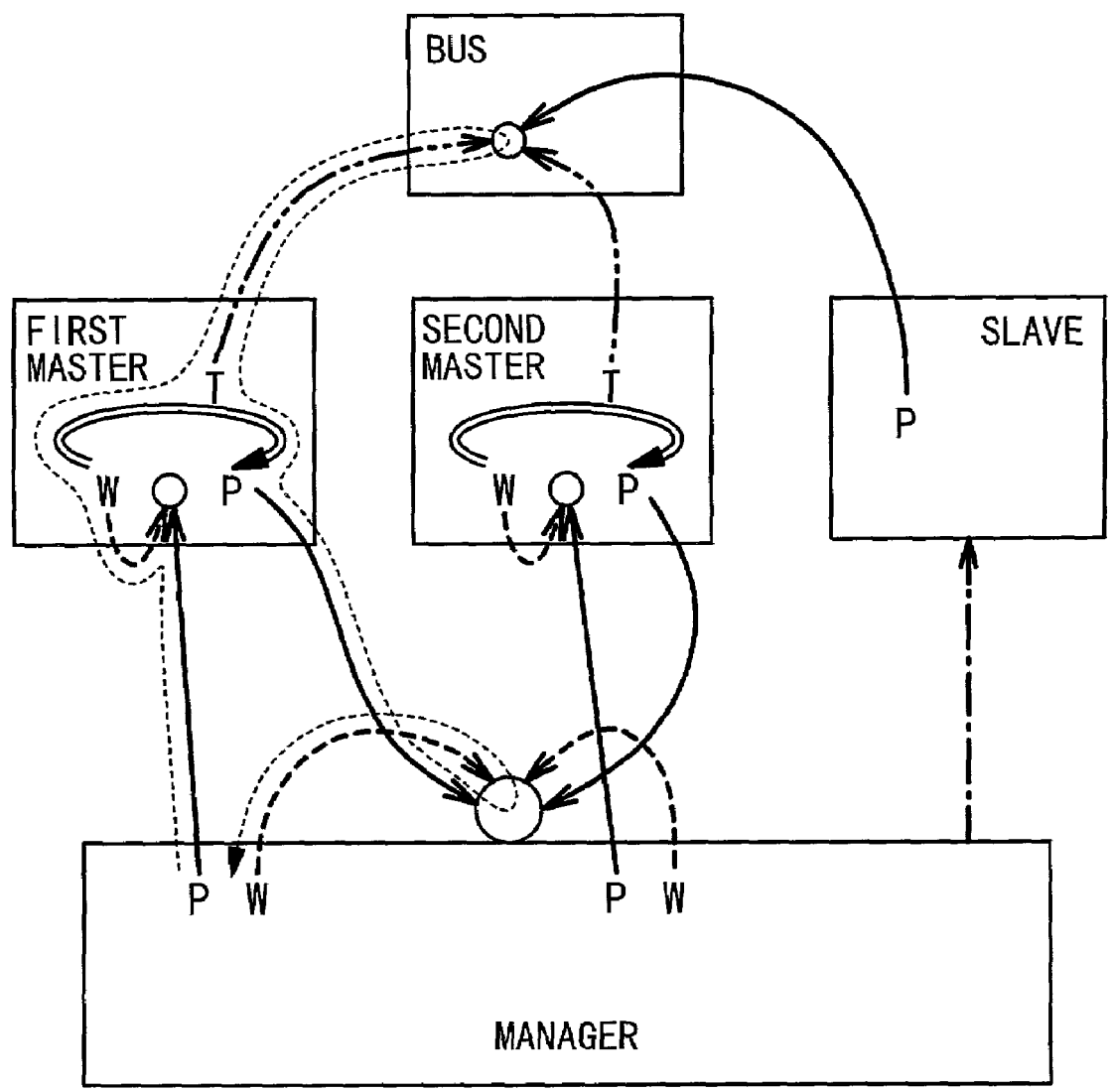
FIG. 3 is an explanatory diagram showing the transfer operation between a first master and a manager in the system simulator shown in FIG. 2.
Figure 4:
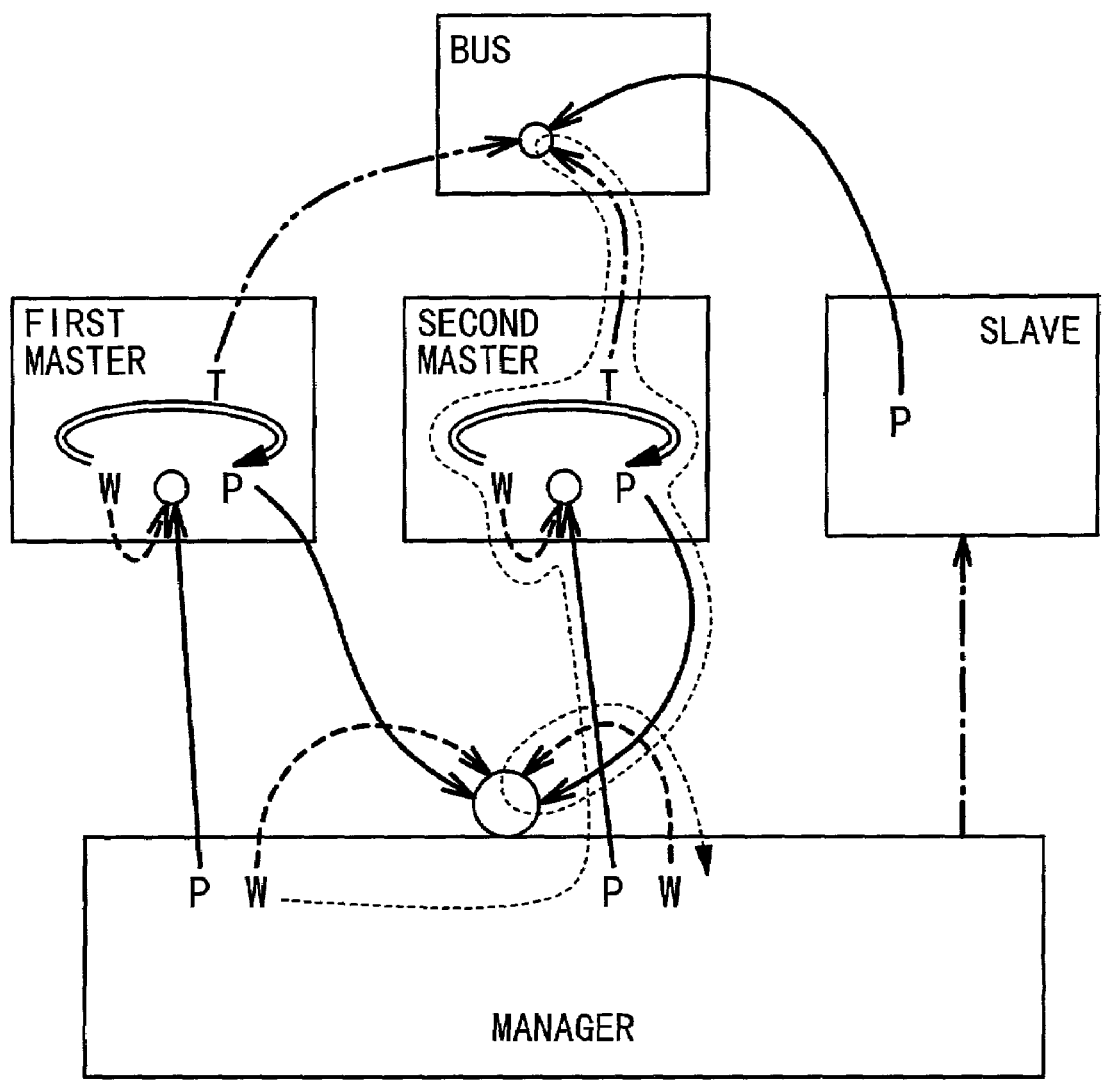
FIG. 4 is an explanatory diagram showing the transfer operation between a second master and the manager in the system simulator shown in FIG. 2.
Figure 5:
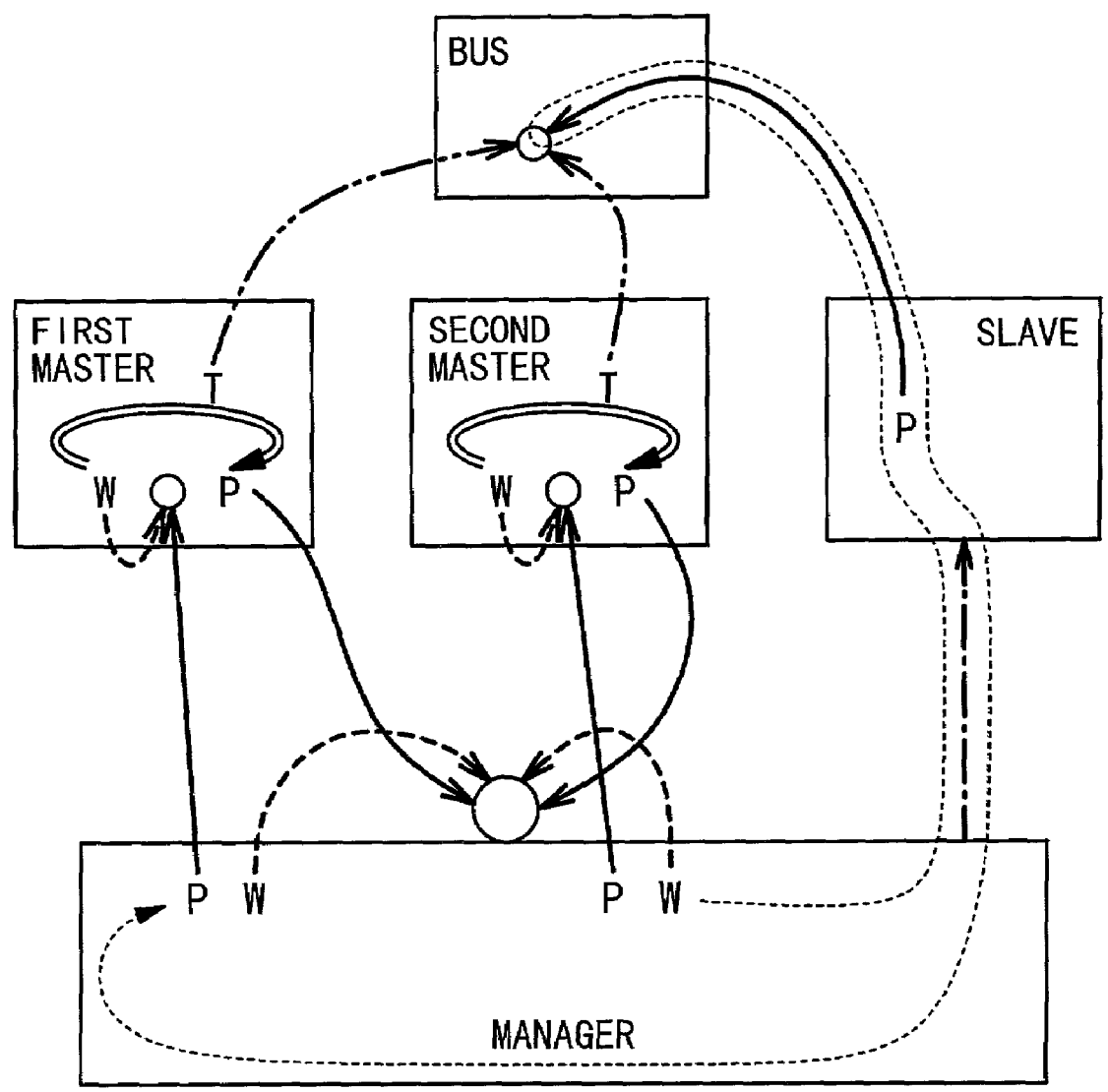
FIG. 5 an explanatory diagram showing the transfer operation between a slave and the manager in the system simulator shown in FIG. 2.
Figure 6:
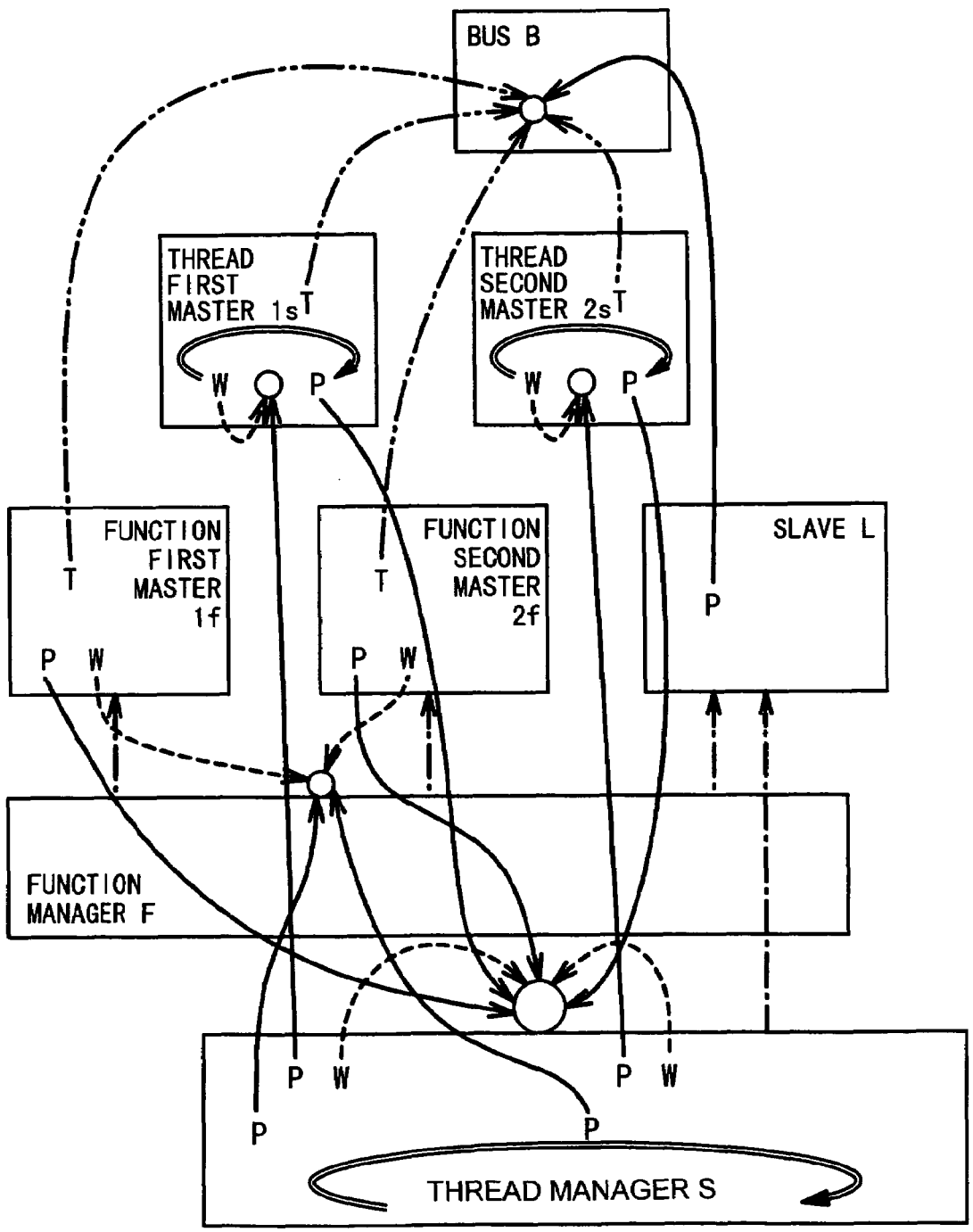
FIG. 6 is a function block diagram showing a configuration of a system simulator according to an embodiment of the present invention.

FIG. 6 is a function block diagram showing the configuration of a system simulator according to an embodiment of the present invention. This simulator is established on an information processing apparatus, such as a personal computer, a work station or a general purpose computer, by installing software. The configuration and the operation of the information processing apparatus are well known. Therefore, their explanations are omitted.

This system simulator is composed of a first master 1f for a function (hereinafter, referred to as "function first master 1f"), a first master 1s for a thread (hereinafter, referred to as "thread first master 1s"), a second master 2f for a function (hereinafter, referred to as "function second master 2f"), a second master 2s for a thread (hereinafter, referred to as "thread second master 2s"), a function manager F, a thread manager S, a slave L and a bus B.

FIG. 6 also shows the transfer of the control in this system simulator. That is, symbols "□" included in the thread first master 1s, the thread second master 2s, the function manager F, the thread manager S and the bus B denote semaphores. Also, a symbol "P" denotes an execution of a post, a symbol "W" denotes an execution of a wait, and a symbol "T" denotes an execution of a try wait, respectively. In FIG. 6, an arrow of an alternate long and short dash line denotes the transfer of the control resulting from the function call, an arrow of a solid line denotes the transfer of the control resulting from the post, an arrow of a broken line denotes the transfer of the control resulting from the wait, and an arrow of an alternate long and two short dashes line denotes the transfer of the control resulting from the try wait, respectively. Moreover, an arrow of a double line denotes an execution of the thread.

The function first master 1f is a simulator composed of a program for simulating an operation of a device used as a master such as CPU and DMA. This function first master 1f performs a read access and a write access to the slave L through the bus B. This function first master 1f is the same thread as the function manager F, and starts an operation in accordance with the function call for each one clock from the function manager F. After the execution of the simulation corresponding to the one clock, the control is returned back to the function manager F.

The thread first master 1s is a simulator composed of a program for simulating the operation of the device used as the master, similarly to the above-mentioned function first master 1f. This thread first master 1s performs the read access and the write access to the slave L through the bus B. This thread first master 1s is a thread different from that of the function manager F. The thread first master 1s starts the execution when the thread manager S, which is also a thread different from that of the function manager F, performs the post to the semaphore of the thread first master 1s. After the completion of the execution, the control is transferred to the thread manager S by performing the wait to the semaphore.

The function first master 1f and the thread first master 1s are constituted as one module, and they are the different threads although having the same text. Actually, the function first master 1f and the thread first master 1s are only different in an execution start position in the module.

The function second master 2f is a simulator composed of a program for simulating an operation of a device used as a master, similarly to the above-mentioned the function first master 1f. This function second master 2f performs a read access and the write access to the slave L through the bus B. This function second master 2f is the same thread as the function manager F, and starts an operation in accordance with the function call for each one clock from the function manager F. After the execution of the simulation corresponding to the one clock, the control is returned back to the function manager F.

The thread second master 2s is a simulator composed of a program for simulating the operation of the device used as the master, similarly to the above-mentioned function second master 2f. This thread second master 2s performs the read access and the write access to the slave L through the bus B. This thread second master 2s is a thread different from the function manager F. The thread second master 2s stats the execution when the thread manager S, which is also a thread different from that of the function manager F, performs the post to the semaphore of the thread second master 2s. After the completion of the execution, the control is transferred to the thread manager S by performing the wait to the semaphore.

The function second master 2f and the thread second master 2s are constituted as one module, and they are the different threads although having the same text. Actually, the function second master 2f and the thread second master 2s are only different in an execution start position in the module The slave L is a simulator composed of a program for simulating a peripheral circuit used as a slave such as a timer, a serial port or a general input output port. This slave L carries out a predetermined operation in response to the read access and the write access performed through the bus B from the function first master 1f, the thread first master 1s, the function second master 2f and the thread second master 2s. This slave L starts an execution in accordance with the function call from the function manager F and the thread manager S.

The bus B is a simulator composed of a program for simulating a bus through which the slave L and each of the function first master 1f, the thread first master 1s, the function second master 2f and the thread second master 2s are connected. This bus B returns the information indicating whether or not the slave L can immediately respond, namely, whether or not the access blocking occurs, in response to an inquiry by using the try wait from the function first master 1f, the thread first master 1s, the function second master 2f and the thread second master 2s.

The function manager F is a control program for performing the function call to the function first master 1f, the thread first master 1s and the slave L in turn, and allowing them to operate in synchronization with each other.

The thread manager S is a control program for carrying out the thread switching to allow the thread first master 1s and the thread second master 2s to operate, and carrying out the function call to the slave for allowing it to operate.

An operation of the system simulator according to the embodiment of the present invention having the above-mentioned configuration will be described below. This system simulator is controlled so as to activate only one of the function first master 1f, the thread first master 1s, the function second master 2f, the thread second master 2s, the function manager F and the thread manager S at the same time.

Figure 7:
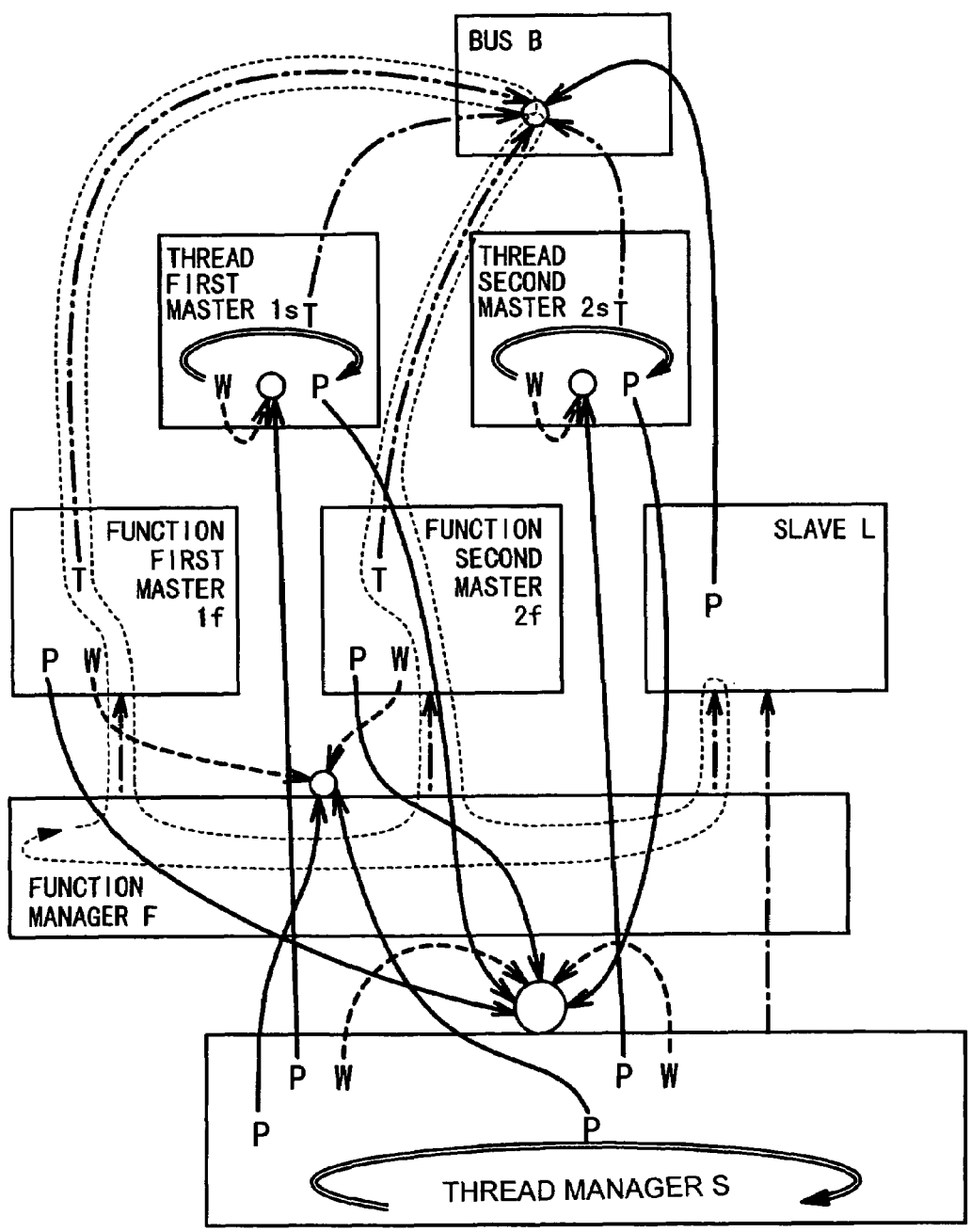
FIG. 7 is an explanatory diagram showing an operation when an access blocking does not occur, in the system simulator according to the embodiment of the present invention.

At first, the operation when the access blocking does not occur is described with reference to FIG. 7. In this case, the system simulator is operated similarly to the simulator according to the first conventional technique. That is, the simulation is advanced while the function manager F performs the function call to the function first master 1f, the function second master 2f and the slave L in turn.

In detail, the function manager F firstly performs the function call to the function first master 1f. Accordingly, the function first master 1f executes a process corresponding to one clock. For example, if the target of the function call is an instruction to be completed in one clock, the control is returned back to the function manager F after the completion of the execution of the instruction. In this process, it is assumed that the access blocking does not occur. Thus, even in a case of a process for accessing the bus B, the process is completed in the one clock. It should be noted that, if the target of the function call is an instruction requiring a plurality of clocks, the control is returned back to the function manager F after the completion of a process corresponding to the one clock.

Next, similarly to the above-mentioned conventional case, the function manager F performs the function call to the function second master 2f, and then performs the function call to the slave L. After that, the simulation is advanced by the cyclic performance of the function call to the function first master 1f □ the function second master 2f □ the slave L □ the function first master 1f □ .... It should be noted that, if the target of the function call is the instruction requiring the plurality of clocks, the instruction is completed by executing the plurality of function calls to the target.

As mentioned above, unless the access blocking occurs, the function first master 1f, the function second master 2f and the slave L sequentially execute the process corresponding to the one clock for each execution of the function call from the function manager F. Thus, they are operated as if they are in synchronization with the clock. Hence, it is possible to carry out the simulation in which the operational timings are considered.

Nest, the operations in the case of the occurrence of the access blocking will be described below with reference to FIGS. 8 to 11. In this case, the system simulator according to this embodiment is operated similarly to the simulator according to the second conventional technique.

Figure 8:
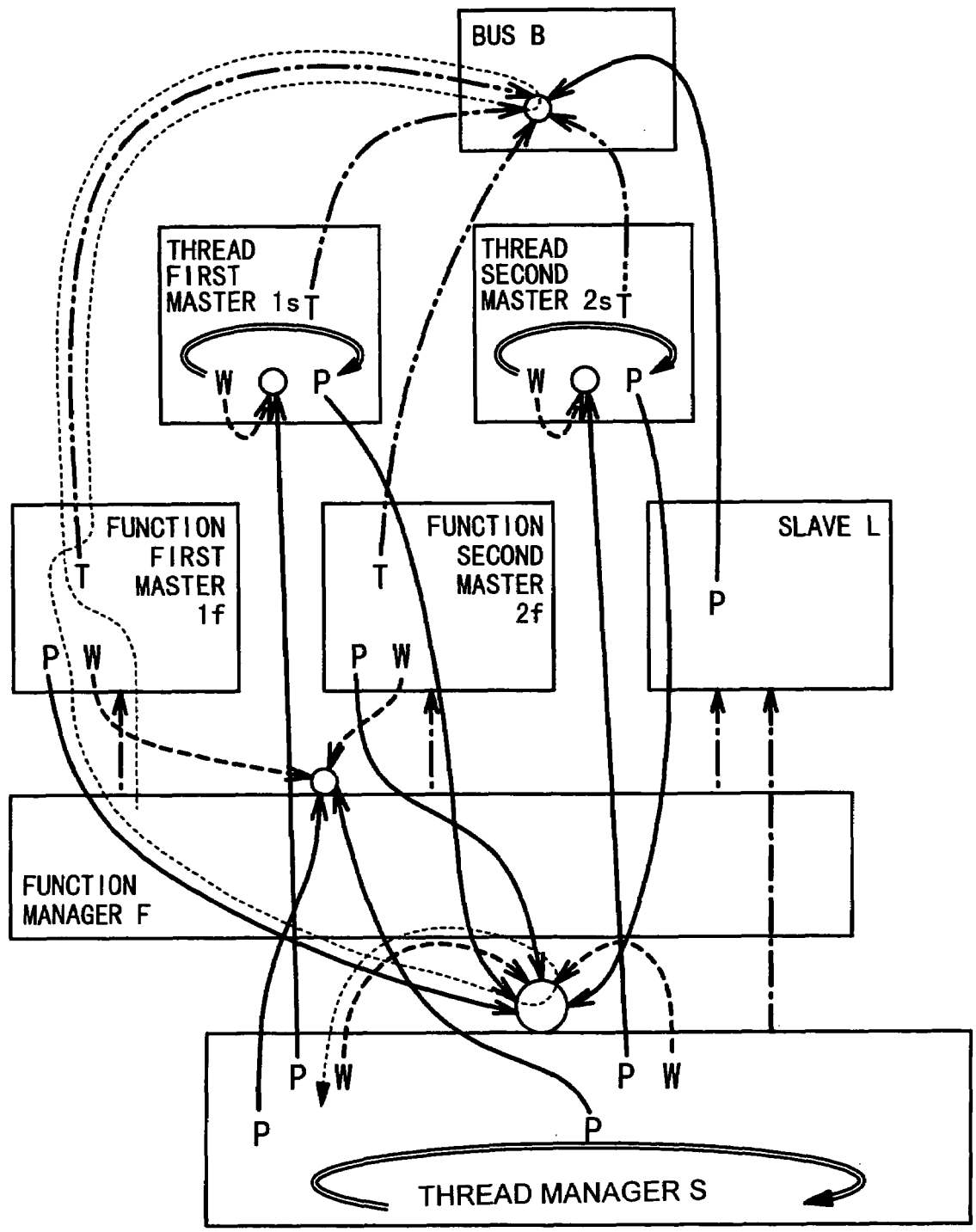
FIG. 8 is an explanatory diagram showing an operation (No. 1) when an access blocking occurs, in the system simulator according to the embodiment of the present invention.

FIG. 8 is an explanatory diagram showing an operation when the access blocking occurs in the process of the function first master 1f, to which the function manager F performs the function call, and the control is transferred to the thread manager S. Dotted lines indicate the flow of the control.

The function manager F firstly performs the function call to the function first master 1f. Accordingly, the function first master 1f executes the process corresponding to the one clock. In this process, the function first master 1f performs the try wait to the semaphore of the bus B. If the try wait is successful, namely, if the access blocking does not occur, the function first master 1f completes the process corresponding to the one clock, as mentioned above, and the control is returned back to the function manager F.

On the other hand, if the try wait is unsuccessful, namely, if the access blocking occurs, as shown by an arrow of dotted lines, the function first master 1f performs the post to the semaphore of the thread manager S, and performs the wait to the semaphore of the function manager F. Thus, the control is transferred from the function manager F to the thread manager S. That is, the thread manager S is activated, and the function manager F enters in a sleep state. After that, the simulation based on the thread switching is started under the control of the thread manager S.

Figure 9:
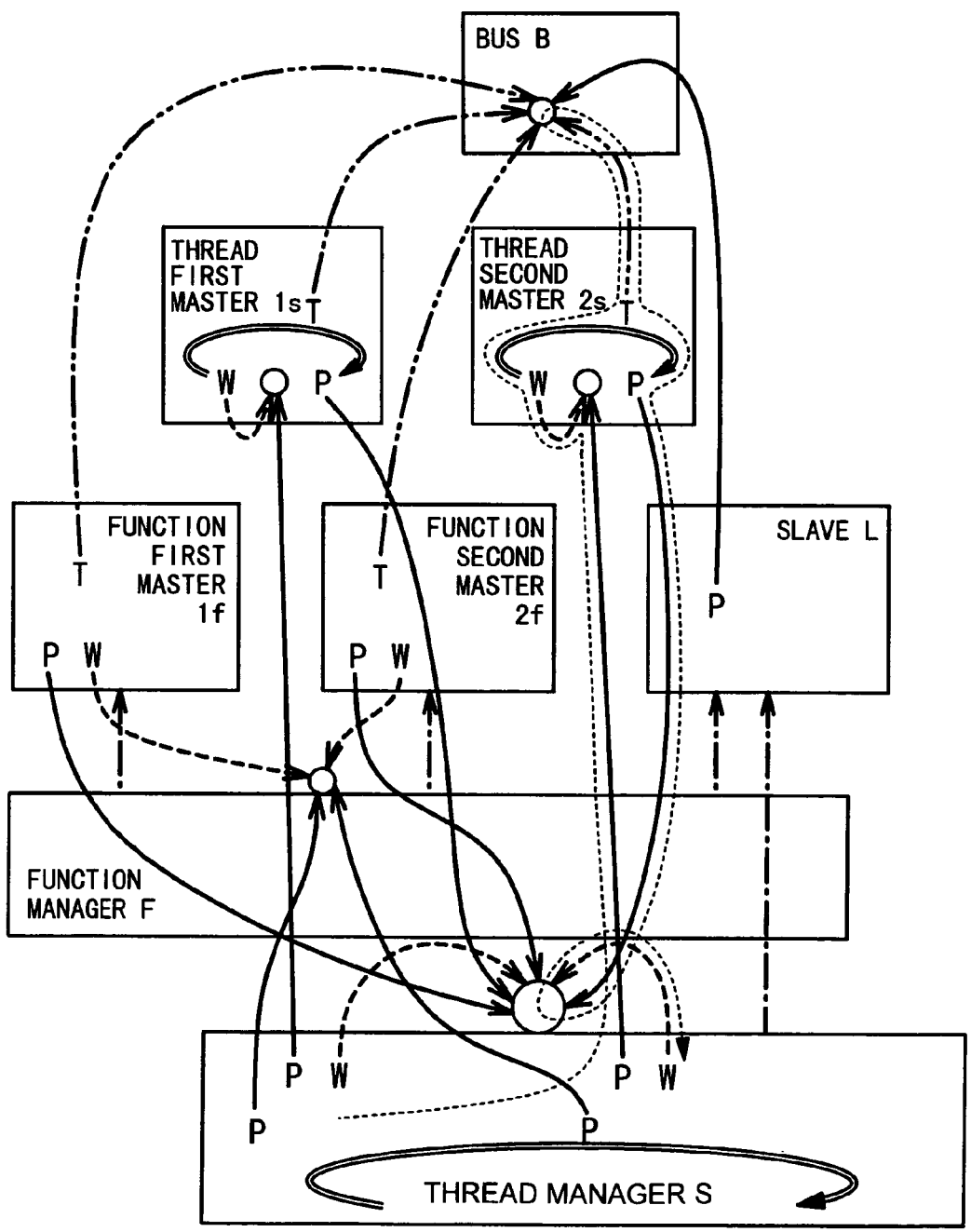
FIG. 9 is an explanatory diagram showing an operation (No. 2) when the access blocking occurs, in the system simulator according to the embodiment of the present invention.

FIG. 9 is an explanatory diagram showing an operation when the access blocking occurs in the process of the thread second master 2s, in which the thread is activated by the thread manager S, and the control is transferred to the thread manager S. The dotted line indicates the flow of the control.

Following the operation shown in FIG. 8, the thread manager S performs the post to the semaphore of the thread second master 2s, and thereby activates the thread of the thread second master 2s. Then, the thread manager S itself enters in the wait state. The thread of the thread second master 2s performs the try wait to the semaphore of the bus B.

As shown by an arrow of a dotted line in FIG. 9, if the try wait is successful, namely, if the access blocking does not occur, after the completion of the process corresponding to the one clock, the thread second master 2s performs the post to the semaphore of the thread manager S, and enters in the wait state. On the other hand, if the try wait is unsuccessful, namely, if the access blocking occurs, the thread second master 2s immediately performs the post to the semaphore of the thread manager S, and enters in the wait state.

Figure 10:
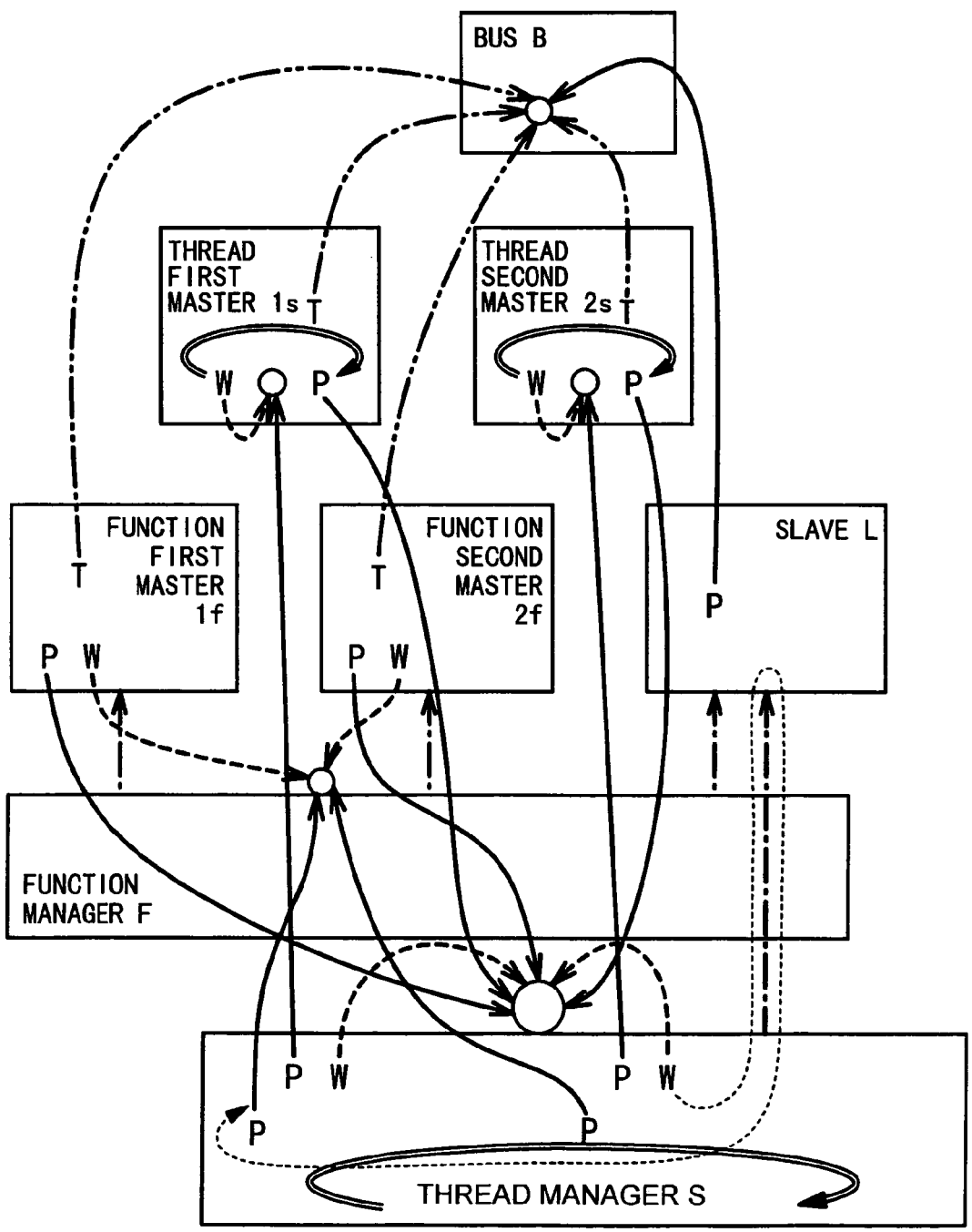
FIG. 10 is an explanatory diagram showing an operation (No. 3) when the access blocking occurs, in the system simulator according to the embodiment of the present invention.

FIG. 10 is an explanatory diagram showing an operation when the slave L, to which the thread manager S performs the function call, completes the process, and the control is then transferred to the thread manager S. The dotted line indicates the flow of the control.

Following the operation shown in FIG. 9, the thread manager S performs the function call to the slave L. Accordingly, the slave L executes the process corresponding to the one clock. In the slave L, when data is prepared in response to a read request from the function first master 1f, the thread first master 1s, the function second master 2f and the thread second master 2s, the slave L performs the post to the semaphore of the bus B. Accordingly, the access blocking state in the bus B is released. After that, the control is returned back to the thread manager S.

Figure 11:
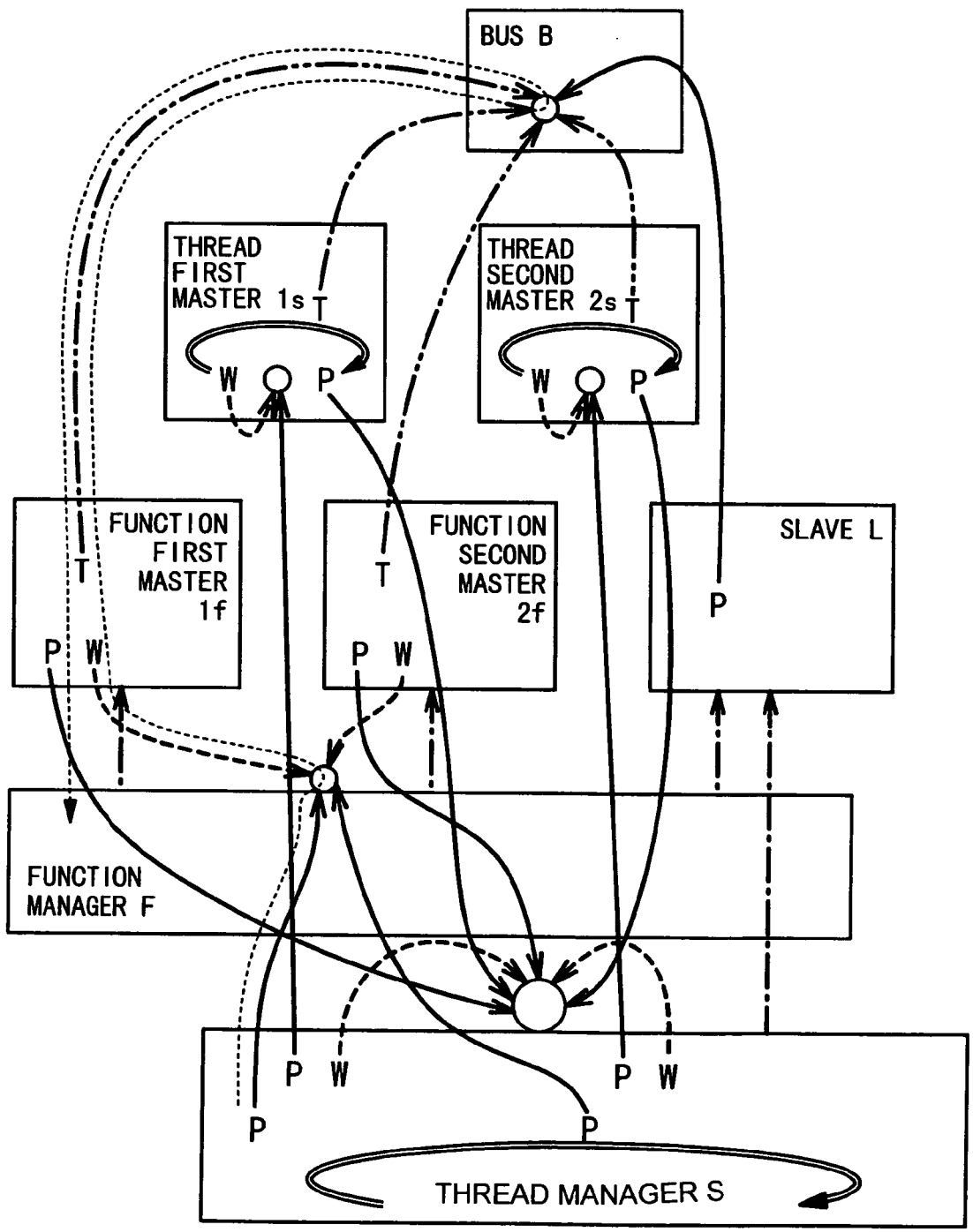
FIG. 11 is an explanatory diagram showing an operation (No. 4) when the access blocking occurs, in the system simulator according to the embodiment of the present invention.

FIG. 11 is an explanatory diagram showing an operation when the access blocking does not occur in the process of the thread first master 1s, to which the thread manager S performs the function call, and the control is transferred to the function manager F. The dotted line indicates the flow of the control.

Following the operations shown in FIG. 10, the thread manager S performs the post to the semaphore of the function manager F. Accordingly, the function first master 1f being in the wait state because of the failure of the try wait is activated and, the function first master 1f again performs the try wait to the semaphore of the bus B. If the try wait is successful, namely, if the access blocking does not occur, the function first master 1f completes the process corresponding to the one clock, and the control is returned back to the function manager F.

On the other hand, if the try wait is unsuccessful, namely, if the access blocking is not canceled, as described with reference to FIG. 8, the function first master 1f performs the post to the semaphore of the thread manager S. After that, the operations similar to those of the above-mentioned case are repeated. When the access blocking is canceled, all the masters are executed in accordance with the function call.

In the system simulator according to the embodiment of the present invention having the above-mentioned configuration, the already-developed instruction set simulator for simulating a single CPU can be used as the simulator of the master as its original state. Thus, it is not necessary to re-design the simulator.

Also, if the access blocking occurs, it is switched from the simulation based on the function call to the simulation based on the thread switching. Thus, differently from the conventional technique, the occurrence of the access blocking never causes the system simulator to get into the dead lock.

Moreover, unless the access blocking occurs, the simulation is executed in accordance with the function call, and the operation based on the thread switching is not performed. As a result, it is possible to reduce the loss time caused by the thread switching to a minimum, and thereby possible to attain the simulation at a high speed.

In order to more understand the present invention, the processes for attaining the above-mentioned operations will be further described below with reference to the flowcharts, mainly in the switching operation between the function manager F and the thread manager S.

Figure 12:
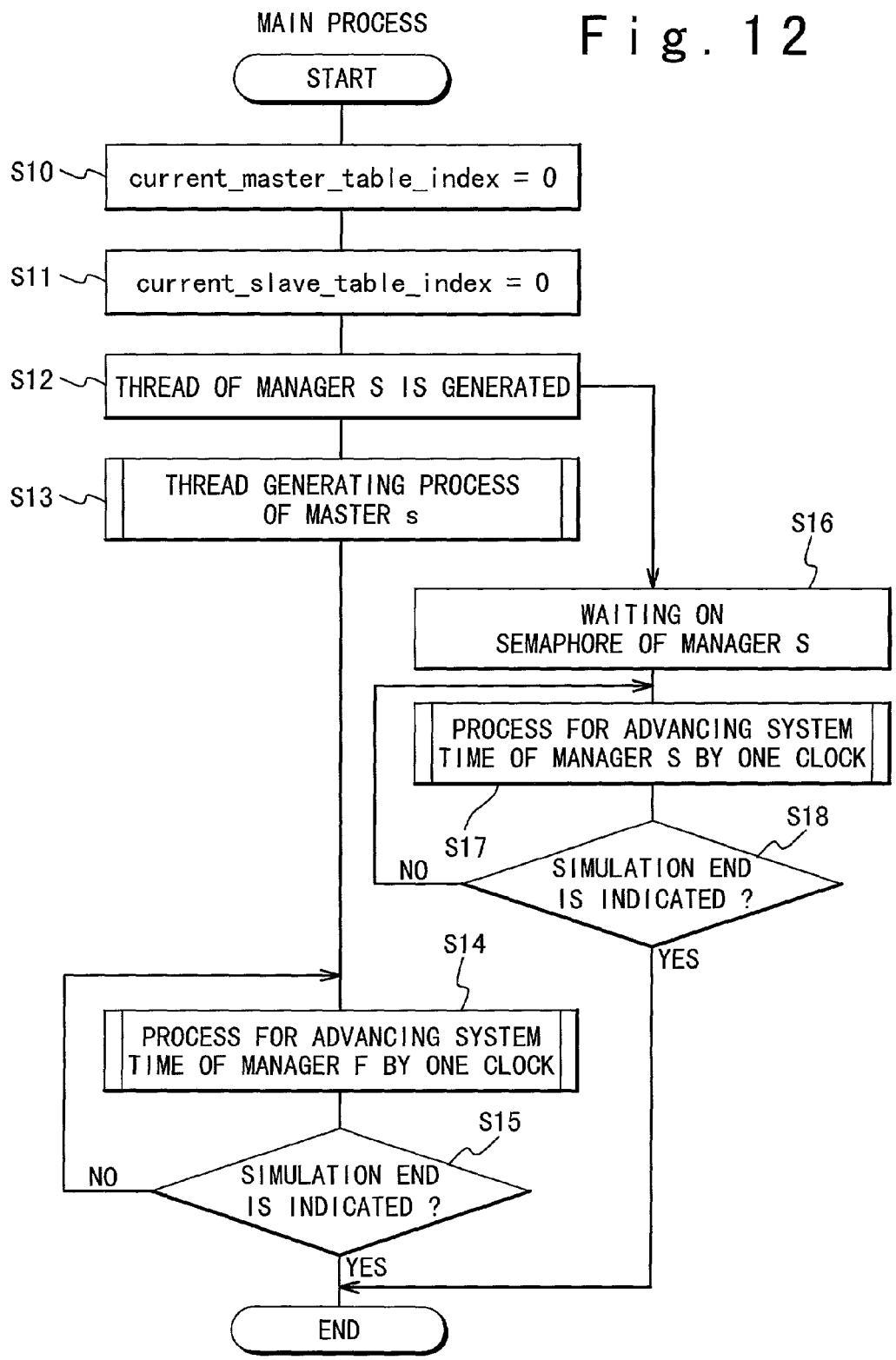
FIG. 12 is a flowchart showing a main process in the system simulator according to the embodiment of the present invention.

FIG. 12 is a flowchart showing the main process in the system simulator according to this embodiment.

In this system simulator, in the function manager F (hereafter, merely referred to as "Manger F") and the thread manager S (hereafter, merely referred to as "Manager S"), the function first master 1f, the thread first master 1s, the function second master 2f and the thread second master 2s (hereafter, they may be collectively merely referred to as "Master") are managed by a table. It should be noted that, hereafter, the function first master 1ƒ and the function second master 2ƒ may be sometime merely referred to as "Master f" and the thread first master 1s and the thread second master 2s may be sometime merely referred to as "Master s".

A current master table index "current_master_table_index" is a table index of a master to advance a clock, which is shared by a manager F and a manager S.

When the simulation is started in the system simulator, at first, the current master table index "current_master_table_index" and a current slave table index "current_slave_table_index" is initially set to zero (Step S10, S11). Then, the thread of the manager S to be used in the simulation is generated (Step S12).

Next, after the execution of the thread generating process of the master s (Step S13) as described later in detail, with regard to the manager F, a process for advancing system time of the manager F by one clock is repeated until an end of the simulation is indicated (Steps S14, S15). On the other hand, with regard to the manager S, the wait is performed on the semaphore of the manager S (Step S16). Then, a process for advancing system time of the manager S by one clock is repeated until the end of the simulation is indicated (Steps S17, S18).

Thus, the simulation is started when the function manager F executes the function call (Steps S14 and S15) at the initial state. After that, the processes at the steps S14 and S17 are suitably executed depending on the presence or absence of the access blocking.

Figure 13:
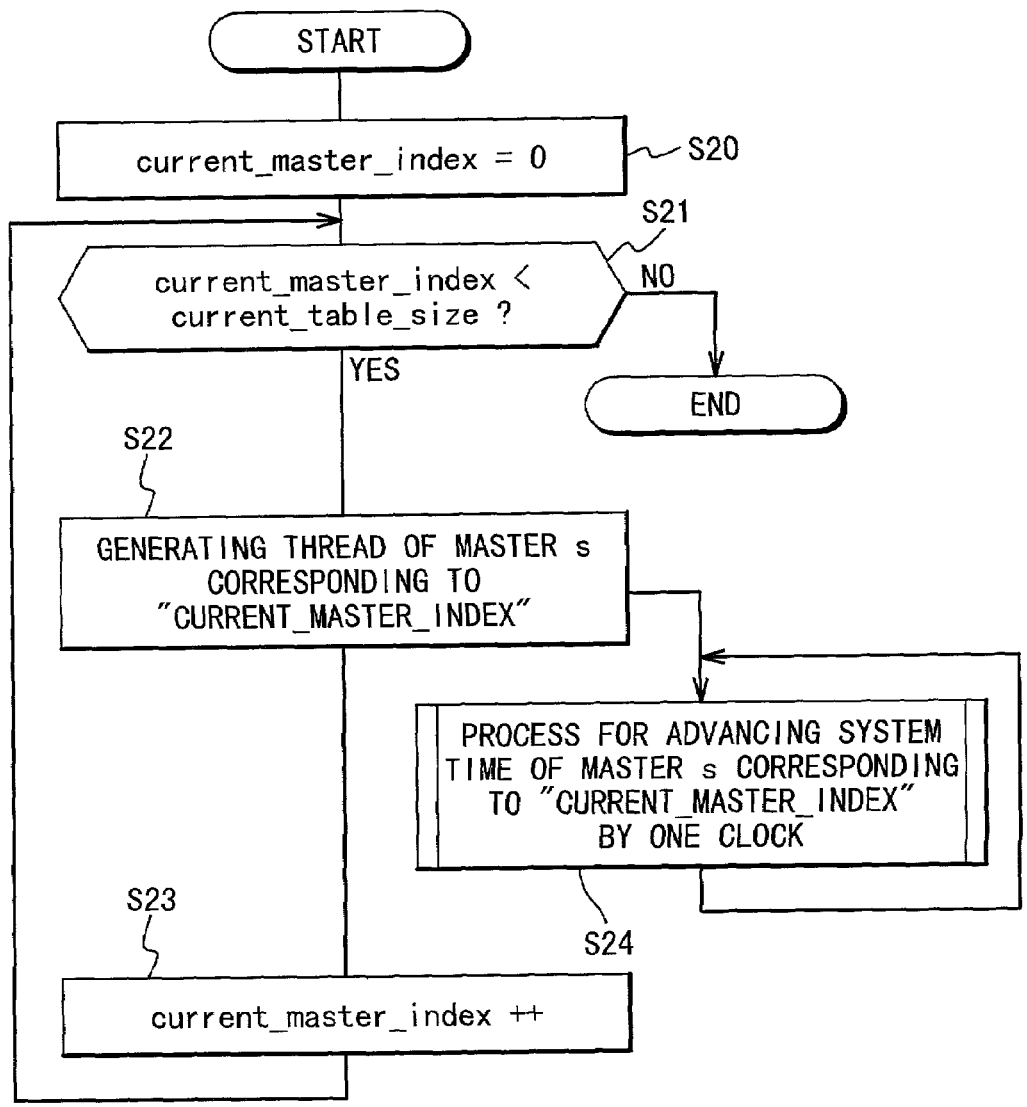
FIG. 13 is a flowchart showing in detail a process for generating a thread of a master s in FIG. 12.

The thread generating process of the master s carried out at the step S13 will be described below in detail with reference to the flowchart shown in FIG. 13.

A current master index "current_master_index" is an index of a master s to be advanced the clock by the manager S.

In the thread generating process of the master s, at first, a current master index "current_master_index" is initially set to zero (Step S20). Next, it is checked whether or not the current master index is smaller than a master table size "master_table_size" (Step S21). When it is judged to be smaller, the thread of the master s corresponding to the current master index "current_master_index" is generated (Step S22).

Next, while the process for advancing system time of the master s by one clock (Step S24) as described later in detail is carried out, a value of the current master index "current_master_index" is incremented by one (Step S23). Then, in order to generate a thread of a next master s, the sequence returns back to the step S21, and the above-mentioned operations are repeated. At the step S21, if the current master index is judged to be equal to or greater than the master table size, the thread generating process of the master s is ended.

Figure 14:
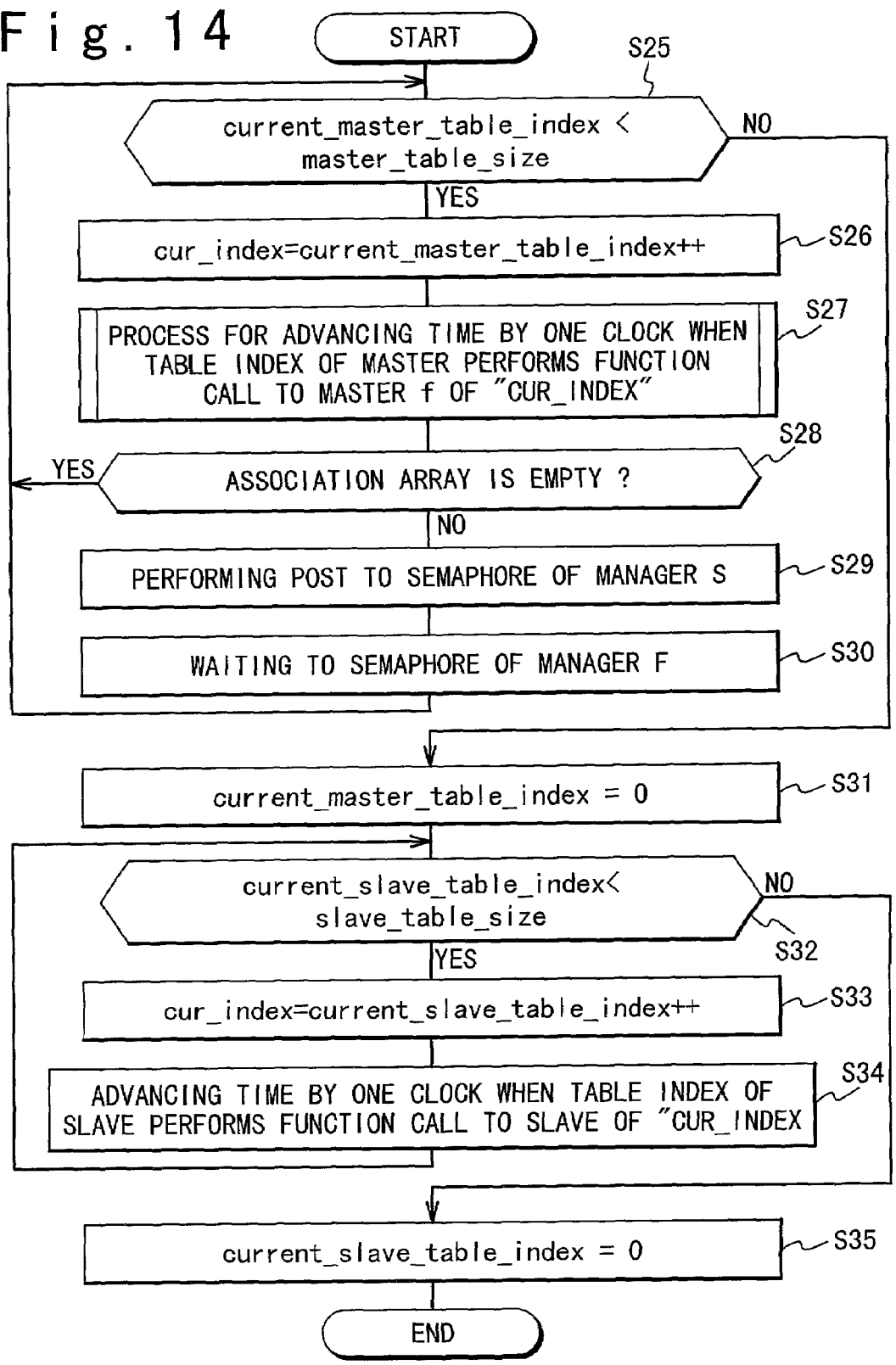
FIG. 14 is a flowchart showing in detail a process for advancing system time of a manager F by one clock in FIG. 12.

The process for advancing the system time of the manager F by one clock performed at the step S14 will be described below in detail with reference to the flowchart shown in FIG. 14.

In this process, it is firstly checked whether or not the current master table index "current_master_table_index" is smaller than the master table size "master_table_size" (Step S25). When it is judged to be smaller, a process "cur_index=current_master_table_index++" is executed for substituting a value of the current master table index "current_master_table_index" into a current index "cur_index" and then incrementing the value of the current master table index "current_master_table_index" by one (Step S26).

Next, a process is carried out for advancing a time by one clock when the table index of the master performs the function call to the master of the current index "cur_index" (Step S27). This process will be described later in detail. Then, it is checked whether or not an association array storing therein the information of the master, in which the access blocking occurs, is empty (Step S28). When the association array is judged to be empty, it is recognized that the access blocking does not occur. Then, the sequence returns back to the step S25, and the above-mentioned operations are repeated for a next master.

On the other hand, if the association array is judged to be not empty, it is recognized that the access blocking occurs, and the post is performed to the semaphore of the manager S (Step S29), and the wait is performed to the semaphore of the manager F (Step S30). Accordingly, the control is transferred from the manager F to the manager S. Then, the simulation based on the thread switching is started under the control of the manager S. After that, the sequence returns back to the step S25, and the above-mentioned operations are repeated for a next master.

At the step S25, if the current master table index "current_master_table_index" is judged to be equal to or greater than the master table size "master_table_size2, the current master table index "current_master_table_index" is reset to zero (Step S31).

Next, it is checked whether or not the current slave table index "current_slave_table_index" is smaller than a slave table size "slave_table_size" (Step S32). When it is judged to be smaller, a process "cur_index=current_slave_table_index++" is executed for substituting a value of the current slave table index "current_slave_table_index" into the current index "cur_index" and then incrementing the value of the current slave table index "current_slave_table_index" by one (Step S33).

Next, a process is carried out for advancing a time by one clock when the table index of the slave performs the function call to the slave of the current index "cur_index" (Step S34). After that, the sequence returns back to the step S25, and the above-mentioned operations are repeated for a next slave.

At the step S32, when the current slave table index "current_slave_table_index" is judged to be equal to or greater than the slave table size "slave_table_size", the current slave table index "current_slave_table_index" is reset to zero (Step S35). After performing this step, the process for advancing the system time of the manager F by the one clock is ended, and the sequence returns back to the main process.

Figure 15:
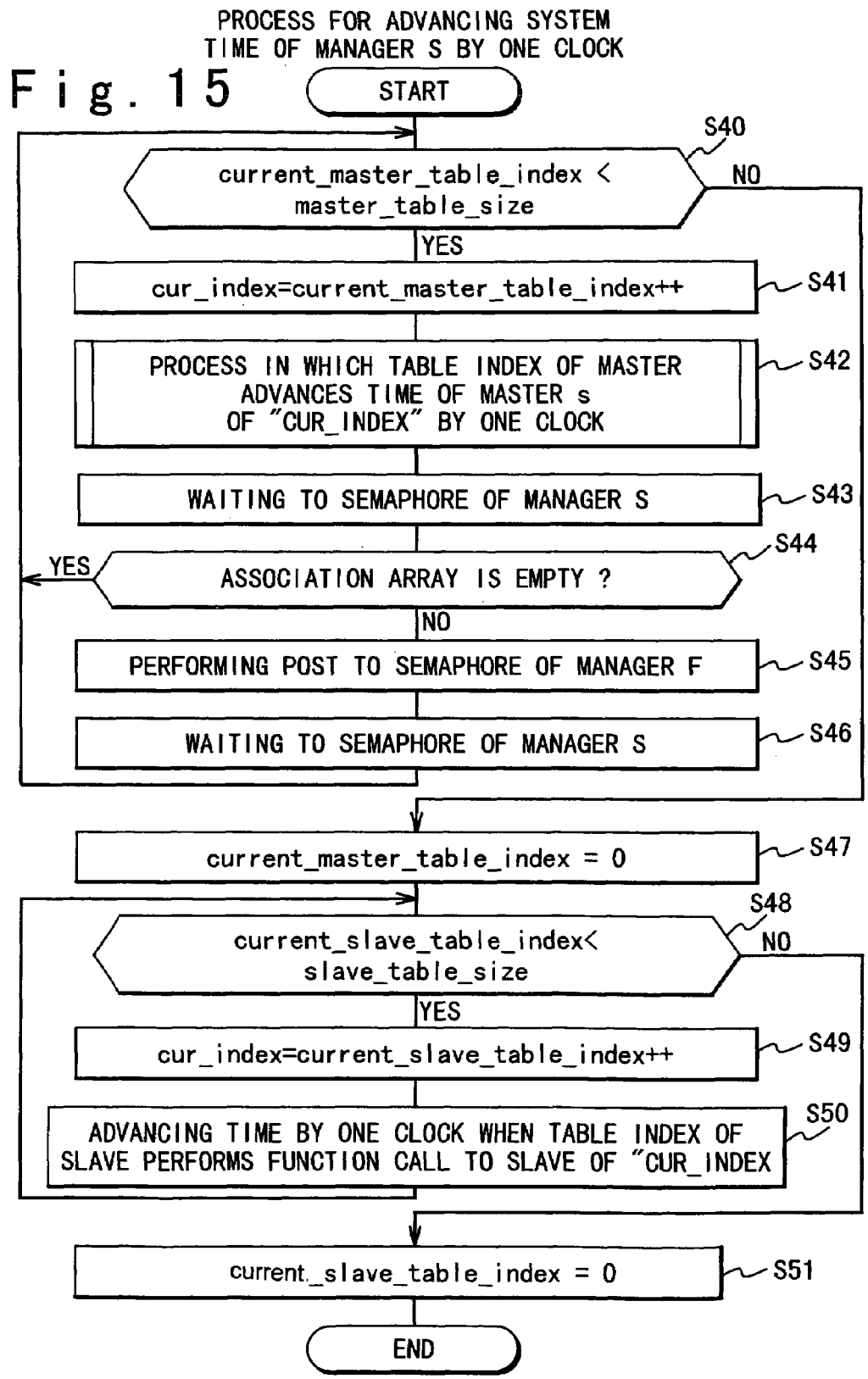
FIG. 15 is a flowchart showing in detail a process for advancing system time of a manager S by one clock in FIG. 12.

The process for advancing the system time of the manager S by one clock done at the step S17 will be described below in detail with reference to the flowchart shown in FIG. 15.

In this process, it is firstly checked whether or not the current master table index "current_master_table_index" is smaller than the master table size "master_table_size" (Step S40). When it is judged to be smaller, a process "cur_index=current_master_table_index++" is executed for substituting the value of the current master table index "current_master_table_index" into the current index "cur_index" and then incrementing the value of the current master table index "current_master_table_index" by one (Step S41).

Next, a process is carried out in which the table index of the master advances the time of the master s of the current index "cur_index" by one clock (Step S42). This process will be described later in detail. Here, if it is set that the post is performed to the semaphore of the manager F in accordance with a report indicative of an occurrence of the access blocking, the post is performed to the semaphore of the manager F. Otherwise, the post is performed to the corresponding master s.

Next, the wait is performed to the semaphore of the manager S (Step S43). Then, it is checked whether or not the association array is empty (Step S44). When the association array is judged to be empty, it is recognized that the access blocking does not occur. Then, the sequence returns back to the step S40, and the above-mentioned operations are repeated for a next master.

On the other hand, if the association array is judged to be not empty, it is recognized that the access blocking occurs, and the post is performed to the semaphore of the manager F (Step S45), and the wait is performed to the semaphore of the manager S (Step S46). Accordingly, the control is transferred from the manager S to the manager F. Then, the simulation based on the function call is carried out under the control of the manager F. After that, the sequence returns back to the step S40, and the above-mentioned operations are repeated for a next master.

At the step S40, when the current master table index "current_master_table_index" is judged to be equal to or greater than the master table size "master_table_size", the current master table index "current_master_table_index" is reset to zero (Step S47).

Next, it is checked whether or not the current slave table index "current_slave_table_index" is smaller than the slave table size "slave_table_size" (Step S48). When it is judged to be smaller, the process "cur_index=current_slave_table_index++" is executed for substituting the value of the current slave table index "current_slave_table_index" into the current index "cur_index" and then incrementing the value of the current slave table index "current_slave_table_index" by one (Step S49).

Next, a process is carried out for advancing a time by one clock when the table index of the slave performs the function call to the slave of the current index "cur_index" (Step S50). After that, the sequence returns back to the step S48, and the above-mentioned operations are repeated for a next slave.

On the other hand, at the step S48, when the current slave table index "current_slave_table_index" is judged to be equal to or greater than the slave table size "slave_table_size", the current slave table index "current_slave_table_index" is reset to zero (Step S51). After performing this step, the process for advancing the system time of the manager S by the one clock is ended, and the sequence returns back to the main process.

Figure 16:
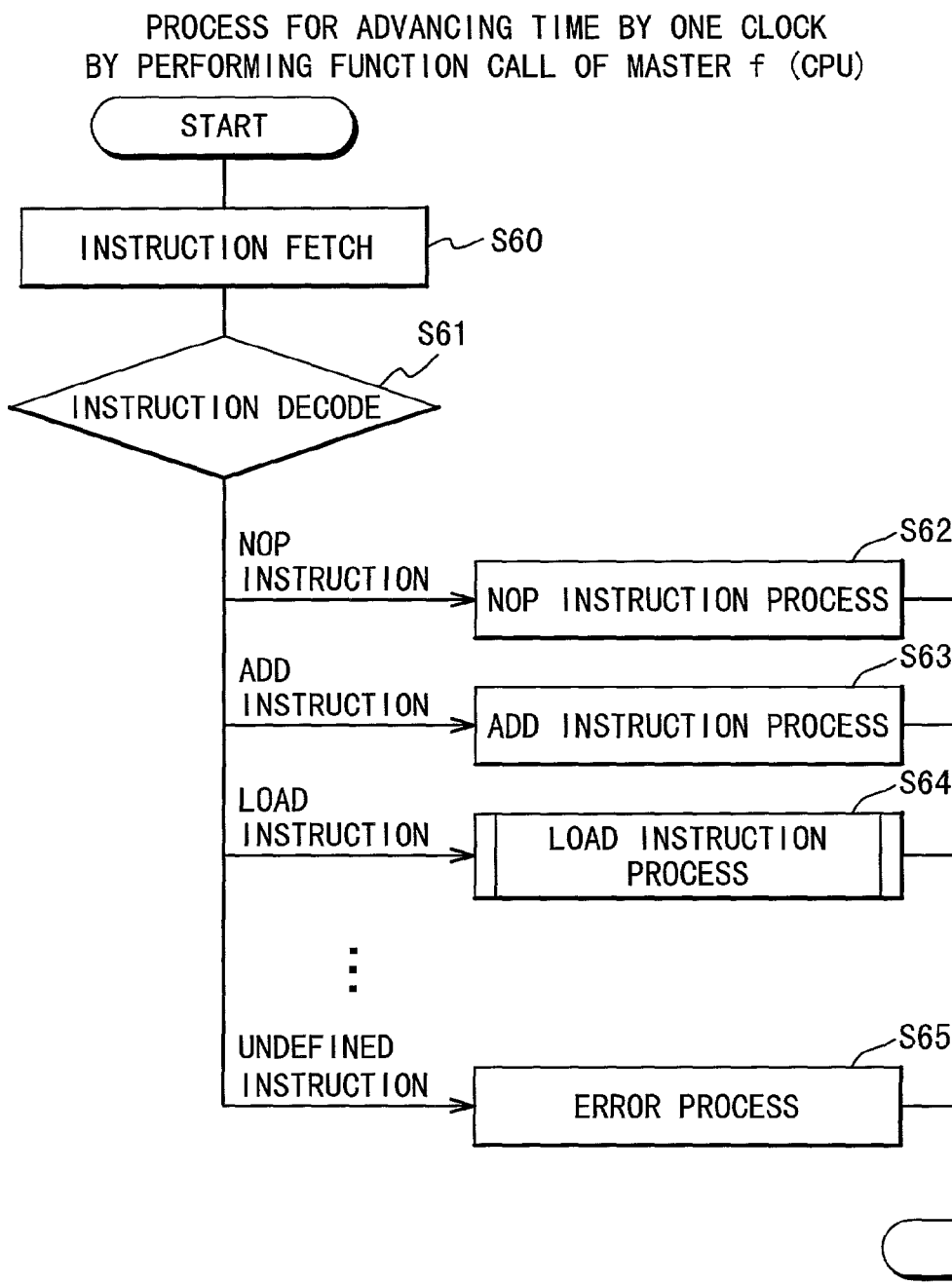
FIG. 16 is a flowchart showing in detail a process of a step S27 in FIG. 14.

The process for advancing the time of the master by one clock performed at the step S27 shown in FIG. 14 will be described below in detail with reference to the flowchart shown in FIG. 16. It should be noted that a case in which CPU is used as the master is exemplified in the following explanation.

In this process, an instruction is firstly fetched (Step S60). Next, the fetched instruction is decoded (Step S61). Any one of an NOP instruction (Step S62), an ADD instruction (Step S63), a LOAD instruction (Step S64), . . . is executed on the basis of the decoded result. When the corresponding instruction does not exist as the decoded result, an error process is carried out (Step S65).

Figure 17:
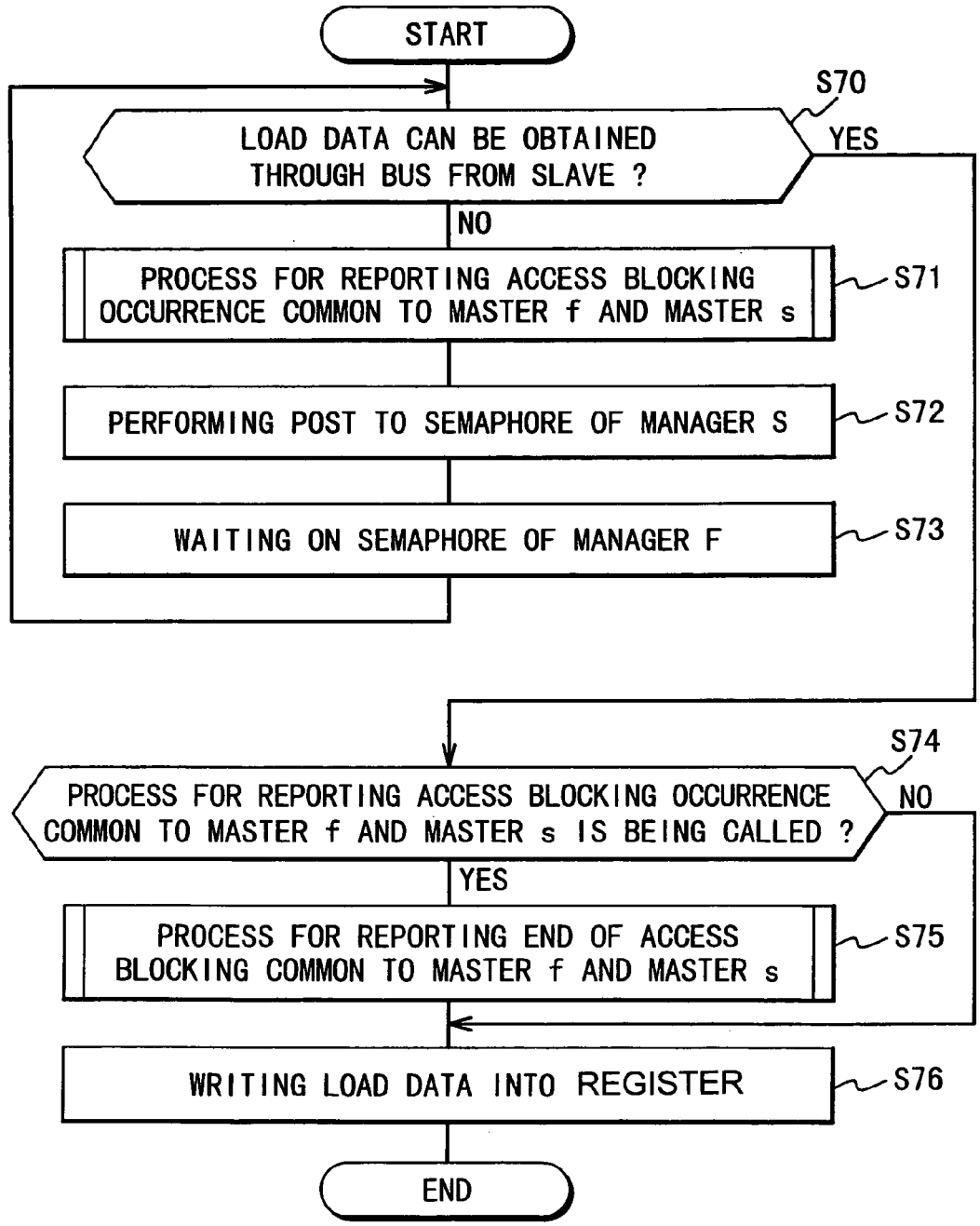
FIG. 17 is a flowchart showing in detail a process of a step S64 in FIG. 16.

An operation of the LOAD instruction executed in accordance with the function call from the manager F will be described below with reference to the flowchart shown in FIG. 17.

Figure 18:
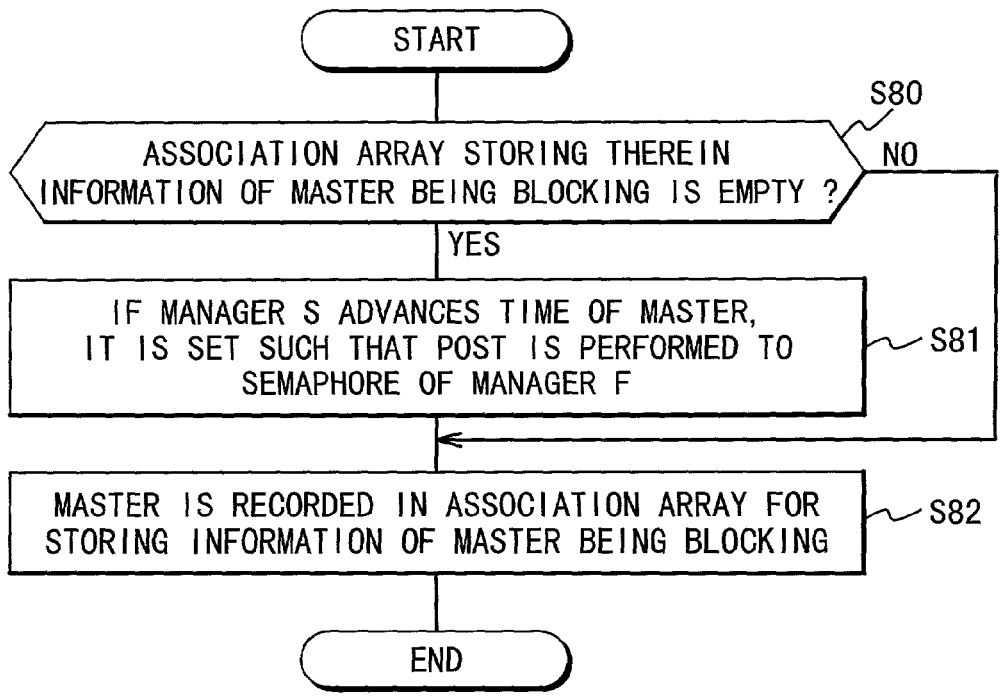
FIG. 18 is a flowchart showing in detail a process of a step S71 in FIG. 17.

When this LOAD instruction is executed, it is firstly checked whether or not load data can be obtained through the bus from the slave (Step S70). In this step S70, when it is so judged that the load data can not be obtained, a process for reporting an access blocking occurrence common to the master f and the master s is carried out (Step S71). This process for reporting the access blocking occurrence is shown in detail in the flowchart of FIG. 18.

In this process for reporting the access blocking occurrence, it is firstly checked whether or not an association array storing therein the information of the master being blocking is empty (Step S80). When it is judged to be empty, if the manager S advances the time of the master, it is set such that the post is performed to the semaphore of the manager F (Step S81). On the other hand, if it is judged to be not empty, the process at the step S81 is skipped. Next, the master is recorded in the association array for storing the information of the master being blocking (Step S82). After that, the sequence returns back to the step S72 of FIG. 17.

At the step S72, the post is performed to the semaphore of the manager S. Next, the wait is performed to the semaphore of the manager F (Step S73). After that, the sequence returns back to the step S70, and the above-mentioned operations are repeated. Accordingly, it is checked whether or not the load data is obtained from the slave for each one clock.

Figure 19:
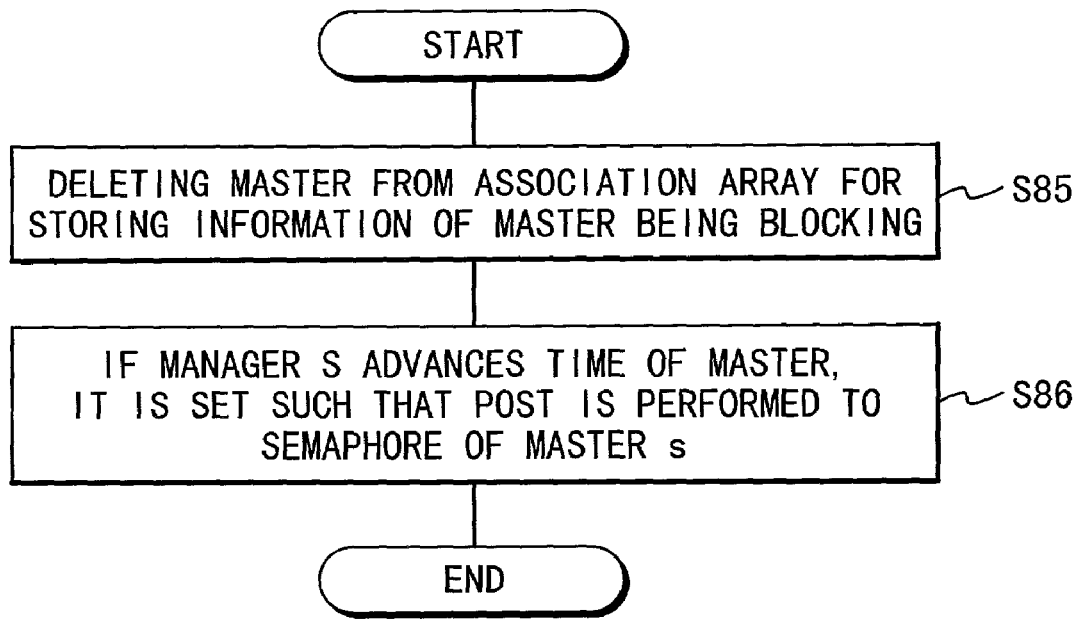
FIG. 19 is a flowchart showing in detail a process of a step S75 in FIG. 17.

When it is judged at the step S70 that the load data can be obtained through the bus from the slave, it is then checked whether or not the process for reporting the access blocking occurrence common to the master f and the master s is being called, namely, whether or not the process at the step S71 is being executed (Step S74). When it is judged that the process for reporting the access blocking occurrence common to the master f and the master s is being called, a process for reporting the end of the access blocking common to the master f and the master s is executed (Step S75). This process for reporting the end of the access blocking is shown in detail in the flowchart of FIG. 19.

This process for reporting the end of the access blocking deletes the master from the association array for storing the information of the master being blocking (Step S85). Then, if the manager S advances the time of the master, it is set that the post is performed to the semaphore of the master s (Step S86). After that, the sequence returns back to the step S76 of FIG. 17.

At the step S76, the load data obtained through the bus from the slave is written to a resister (not shown) instructed by the LOAD instruction. Accordingly, the execution of the LOAD instruction is completed.

Figure 20:
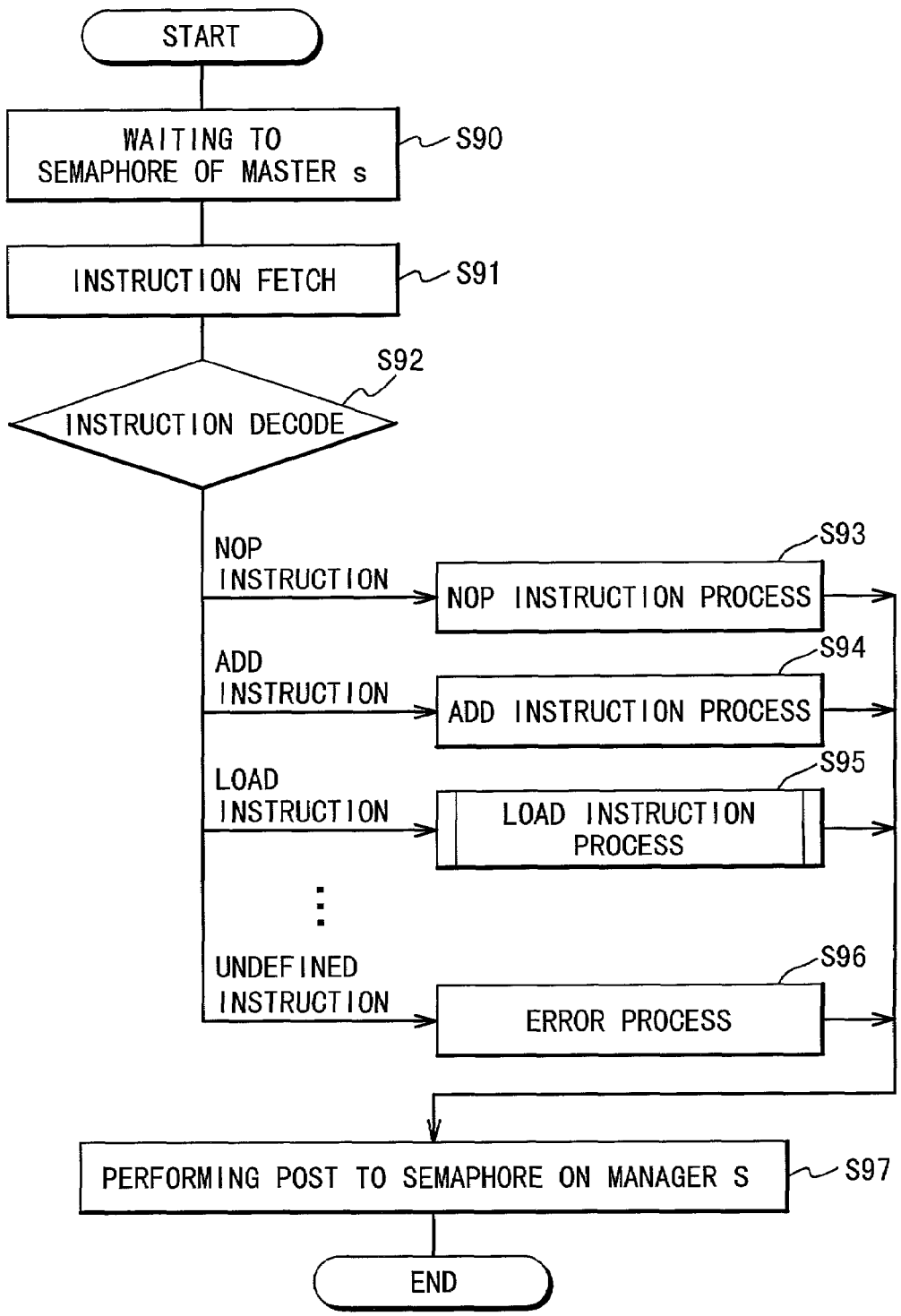
FIG. 20 is a flowchart showing in detail a process of a step S42 in FIG. 15.

The process for advancing the time of the master by one clock performed at the step S42 will be described below in detail with reference to the flowchart shown in FIG. 20. It should be noted that a case in which CPU is used as the master is exemplified in the following explanation.

In this process, the wait is firstly performed to the semaphore of the master s (Step S90). Next, the instruction is fetched (Step S91). Then, the fetched instruction is decoded (Step S92). Any one of the NOP instruction (Step S93), the ADD instruction (Step S94), the LOAD instruction (Step S95), . . . is executed on the basis of the decoded result. When the corresponding instruction does not exist as the decoded result, the error process is performed (Step S96). Then, the post is performed to the semaphore of the manager S (Step S97).

An operation of the LOAD instruction activated by the master s will be described below with reference to the flowchart shown in FIG. 21.

When this LOAD instruction is executed, it is firstly checked whether or not the load data can be obtained through the bus from the slave (Step S100). In this step S100, when it is judged that the load data can not be obtained, a process for reporting an access blocking occurrence common to the master f and the master s is done (Step S101). This process for reporting the access blocking occurrence was already described in detail with reference to the flowchart of FIG. 18.

Next, the post is performed to the semaphore of the manager S (Step S102). Then, the wait is performed to the semaphore of the master s (Step S103). After that, the sequence returns back to the step S100, and the above-mentioned operations are repeated. Accordingly, it is checked whether or not the load data is obtained from the slave for each one clock.

When it is judged at the step S100 that the load data can be obtained through the bus from the slave, it is then checked whether or not the process for reporting the access blocking occurrence common to the master f and the master s is being called, namely, whether or not the process at the step S101 is being executed (Step S104). When it is judged that the process for reporting the access blocking occurrence common to the master f and the master s is being called, a process for reporting the end of the access blocking common to the master f and the master s is executed (Step S105). This process for reporting the end of the access blocking was already described in detail in the flowchart of FIG. 19.

Next, the load data obtained through the bus from the slave is written to the resister (not shown) instructed by the LOAD instruction (Step S106). Accordingly, the execution of the LOAD instruction is completed.

The operations described with reference to FIGS. 7 to 11 are attained by the above-mentioned processes.

It should be noted that, in the above-mentioned embodiment, the case in the simulation of the apparatus including the two masters and the one slave is described as the example. However, in the present invention, the number of the masters and the number of the slaves are not limited to them. The numbers may be arbitrary.

As detailed above, according to the present invention, it is possible to provide the system simulator, the simulation method and the simulation program, which can carry out the simulation at the high speed without getting into the dead lock state caused by the access blocking and without changing the simulator for simulating the conventional bus master.

What is claimed is:

1. A simulation method to be performed on a computer, said method comprising:
   providing a master simulator configured to simulate a bus master and a slave simulator configured to simulate a bus slave;
   sequentially actuating said master simulator and said slave simulator by using a function call; and
   when said master simulator is to be activated by using said function call to access said slave simulator and an access blocking is caused, using said master simulator to control a thread manager such that said master simulator is actuated by using thread switching carried out by said thread manager, to cancel said access blocking.

2. The simulation method according to claim 1, wherein actuating said master simulator by using a thread switching further activates said slave simulator by using said function call.

3. The simulation method according to claim 2, further comprising:
   actuating said master simulator by using said function call, after said access blocking is canceled.

4. The simulation method according to claim 1, further comprising:
   actuating said master simulator by using said function call, after said access blocking is canceled.

5. A programmable storage medium storing a simulation program to be operated on a computer, said program comprising:
   a master simulation program configured to simulate a bus master;
   a slave simulation program configured to simulate a bus slave;
   a function manager program configured to sequentially activate said master simulation program and said slave simulation program by using a function call; and
   a thread manager program configured to activate said master simulation program by using a thread switching,
   wherein when said master simulation program is to be activated by using said function call from said function manager program to access said slave simulation program and an access blocking is caused, then said master simulation program controls said thread manager program such that said master simulation program is activated by using said thread switching carried out by said thread manager program, to cancel said access blocking.

6. The programmable storage medium storing a simulation program according to claim 5, wherein said thread manager program further activates said slave simulation program by using said function call.

7. The programmable storage medium storing a simulation program according to claim 6, wherein after said access blocking is canceled, said thread manager program controls said function manager program such that said master simulation program is activated by using said function call.

8. The programmable storage medium storing a simulation program according to claim 5, wherein after said access blocking is canceled, said thread manager program controls said function manager program such that said master simulation program is activated by using said function call.

9. A programmable storage medium storing a simulation program to be operated on a computer, said program comprising:
   first means for simulating a bus master;
   second means for simulating a bus slave;
   third means for sequentially activating said first means and said second means by using a function call; and
   fourth means for activating said first means by using a thread switching,
   wherein when said first means is to be activated by using said function call from said third means to access second means, and an access blocking is caused, then said first means controls said fourth means such that said first means is activated by using said thread switching carried out by said fourth means, to cancel said access blocking.

* * * * *